(12) United States Patent
Kageyama et al.

(10) Patent No.: US 11,289,405 B2
(45) Date of Patent: Mar. 29, 2022

(54) SEMICONDUCTOR DEVICE

(71) Applicant: ROHM CO., LTD., Kyoto (JP)

(72) Inventors: Satoshi Kageyama, Kyoto (JP); Yoshihisa Takada, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 16/939,502

(22) Filed: Jul. 27, 2020

(65) Prior Publication Data
US 2021/0035889 A1 Feb. 4, 2021

(30) Foreign Application Priority Data

Aug. 2, 2019 (JP) .............................. JP2019-143016

(51) Int. Cl.
*H01L 23/488* (2006.01)
*H01L 23/00* (2006.01)
*H01L 23/04* (2006.01)
*H01L 23/12* (2006.01)

(52) U.S. Cl.
CPC ............ *H01L 23/488* (2013.01); *H01L 23/04* (2013.01); *H01L 23/12* (2013.01); *H01L 24/14* (2013.01)

(58) Field of Classification Search
CPC ....... H01L 23/488; H01L 23/04; H01L 23/12; H01L 24/14
See application file for complete search history.

(56) References Cited

U.S. PATENT DOCUMENTS

| 2008/0236879 | A1* | 10/2008 | Kohara | ................ | H05K 3/3452 |
| | | | | | 174/261 |
| 2016/0020163 | A1* | 1/2016 | Shimizu | ............ | H01L 23/49822 |
| | | | | | 361/768 |
| 2018/0332720 | A1* | 11/2018 | Harkness, Jr. | ........... | H05K 3/22 |

FOREIGN PATENT DOCUMENTS

JP 2010-141126 A 6/2010

* cited by examiner

*Primary Examiner* — Peniel M Gumedzoe
(74) *Attorney, Agent, or Firm* — Hamre, Schumann, Mueller & Larson, P.C.

(57) ABSTRACT

There is provided a semiconductor device that includes a wiring layer having a main surface and a rear surface which face opposite sides in a thickness direction, a first insulating layer covering an entirety of the rear surface, a second insulating layer which is in contact with the main surface, a semiconductor element which faces the second insulating layer and is mounted on the wiring layer, and a sealing resin which is in contact with the second insulating layer and covers the semiconductor element, wherein surface roughness of the main surface is larger than surface roughness of the rear surface.

4 Claims, 22 Drawing Sheets

SEMICONDUCTOR DEVICE

CROSS-REFERENCE TO RELATED APPLICATION

This application is based upon and claims the benefit of priority from Japanese Patent Application No. 2019-143016, filed on Aug. 2, 2019, the entire contents of which are incorporated herein by reference.

TECHNICAL FIELD

The present disclosure relates to a semiconductor device including an insulating layer that covers a wiring layer.

BACKGROUND

In the related art, there is disclosed a semiconductor device including an insulating layer made of a material containing a synthetic resin, a wiring layer arranged inside and on the surface of the insulating layer, a semiconductor chip bonded to the wiring layer, and a resin composition encapsulating the semiconductor chip. The semiconductor device is manufactured on a support layer that is relatively strong against bending and the like by a method similar to that of manufacturing a semiconductor chip. The support layer is removed after forming the resin composition. Accordingly, the thicknesses of the insulating layer and the wiring layer can be made as small as possible, so that the semiconductor device can be miniaturized.

The semiconductor device disclosed in the related art includes two insulating layers. Of these insulating layers, the lower insulating layer supports the wiring layer. The upper insulating layer covers the wiring layer. As a result, a leakage current from the wiring layer can be suppressed. However, if the adhesion between the wiring layer and the insulating layer covering the wiring layer is not sufficient, it is difficult to sufficiently exhibit the effect of suppressing the leakage current. Therefore, there is a need for a measure to further improve the adhesion.

SUMMARY

Some embodiments of the present disclosure provide a semiconductor device capable of further improving adhesion between a wiring layer and an insulating layer covering the wiring layer.

According to one embodiment of the present disclosure, there is provided a semiconductor device that includes a wiring layer having a main surface and a rear surface which face opposite sides in a thickness direction, a first insulating layer covering an entirety of the rear surface, a second insulating layer which is in contact with the main surface, a semiconductor element which faces the second insulating layer and is mounted on the wiring layer, and a sealing resin which is in contact with the second insulating layer and covers the semiconductor element, wherein surface roughness of the main surface is larger than surface roughness of the rear surface.

According to one embodiment of the present disclosure, the first insulating layer and the second insulating layer are made of a material containing an organic compound.

According to one embodiment of the present disclosure, the wiring layer includes a plurality of first bump portions protruding from the main surface in the thickness direction, the semiconductor element includes a plurality of pads facing the plurality of first bump portions, and the plurality of pads are individually bonded to the plurality of first bump portions.

According to one embodiment of the present disclosure, the second insulating layer includes a plurality of first openings which penetrate in the thickness direction, and the plurality of first bump portions are individually accommodated in the plurality of first openings.

According to one embodiment of the present disclosure, the second insulating layer covers an entirety of the main surface.

According to one embodiment of the present disclosure, the second insulating layer is in contact with the first insulating layer.

According to one embodiment of the present disclosure, the semiconductor device further includes a plurality of electronic components, wherein each of the electronic components includes a pair of electrodes which are located to be spaced apart from each other, wherein the wiring layer includes a plurality of second bump portions which protrude from the main surface in the thickness direction, and wherein the pair of electrodes of each of the plurality of electronic components is individually bonded to two adjacent second bump portions of the plurality of second bump portions.

According to one embodiment of the present disclosure, an area of each of the plurality of second bump portions is larger than an area of each of the plurality of first bump portions when viewed along the thickness direction.

According to one embodiment of the present disclosure, the second insulating layer includes a plurality of second openings which penetrate in the thickness direction, and the plurality of second bump portions are individually accommodated in the plurality of second openings.

According to one embodiment of the present disclosure, the first insulating layer includes a plurality of penetrating portions which penetrate in the thickness direction, the wiring layer includes a plurality of base portions which has the main surface, a bottom surface facing a side opposite to the main surface, and a side surface connected to the main surface and the bottom surface, and the plurality of base portions include portions individually accommodated in the plurality of penetrating portions.

According to one embodiment of the present disclosure, the semiconductor device further includes a plurality of terminals, wherein the plurality of terminals individually cover bottom surfaces of the plurality of base portions.

According to one embodiment of the present disclosure, the side surface of each of the plurality of base portions includes an exposed portion exposed from any of the plurality of penetrating portions.

According to one embodiment of the present disclosure, each of the plurality of terminals includes a bottom portion which covers the bottom surface of any of the plurality of base portions, and a side portion which covers the exposed portion of any of the plurality of base portions which is connected to the bottom surface.

According to one embodiment of the present disclosure, the wiring layer includes a plurality of columnar portions that extends from the main surface of any of the plurality of base portions in the thickness direction, each of the plurality of columnar portions has an inner side surface facing the semiconductor element, and an outer side surface facing a side opposite to the inner side surface, and the outer side surfaces of the plurality of columnar portions are exposed from the sealing resin.

According to one embodiment of the present disclosure, the outer side surface of each of the plurality of columnar portions is flush with the exposed portion of any of the plurality of base portions.

According to one embodiment of the present disclosure, the side portion of each of the plurality of terminals covers the outer side surface of any of the plurality of columnar portions.

According to one embodiment of the present disclosure, inner side surfaces of the plurality of columnar portions are in contact with the sealing resin, and surface roughness of the inner side surface of each of the plurality of columnar portions is larger than surface roughness of the rear surface.

Other features and advantages of the present disclosure will be more apparent from the detailed description given below with reference to the accompanying drawings.

DETAILED DESCRIPTION

Embodiments for carrying out the present disclosure will be described with reference to the accompanying drawings.

First Embodiment

Figure 1:
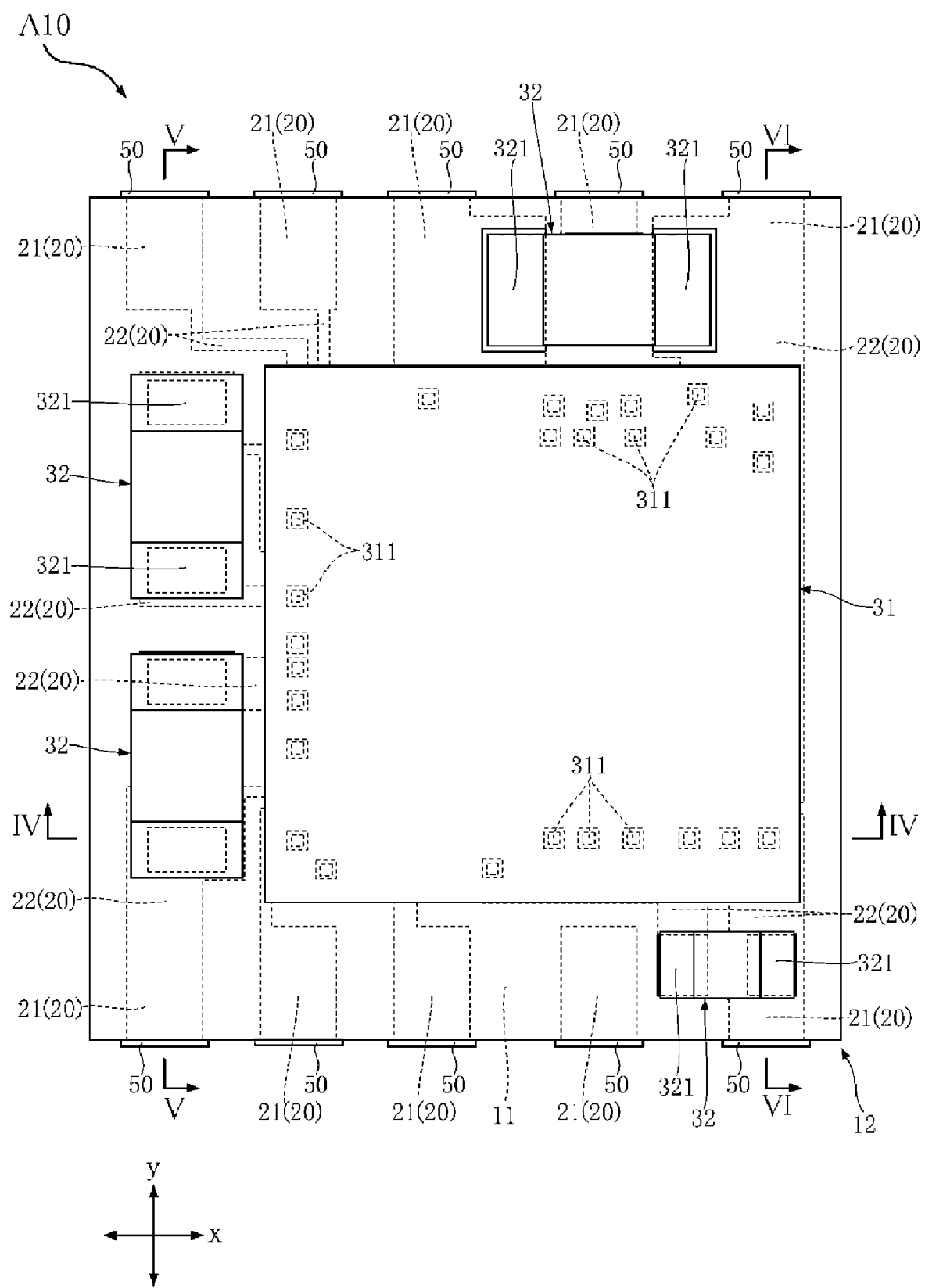
FIG. 1 is a plan view of a semiconductor device according to a first embodiment of the present disclosure, in which a sealing resin is illustrated to be transparent.
Figure 2:
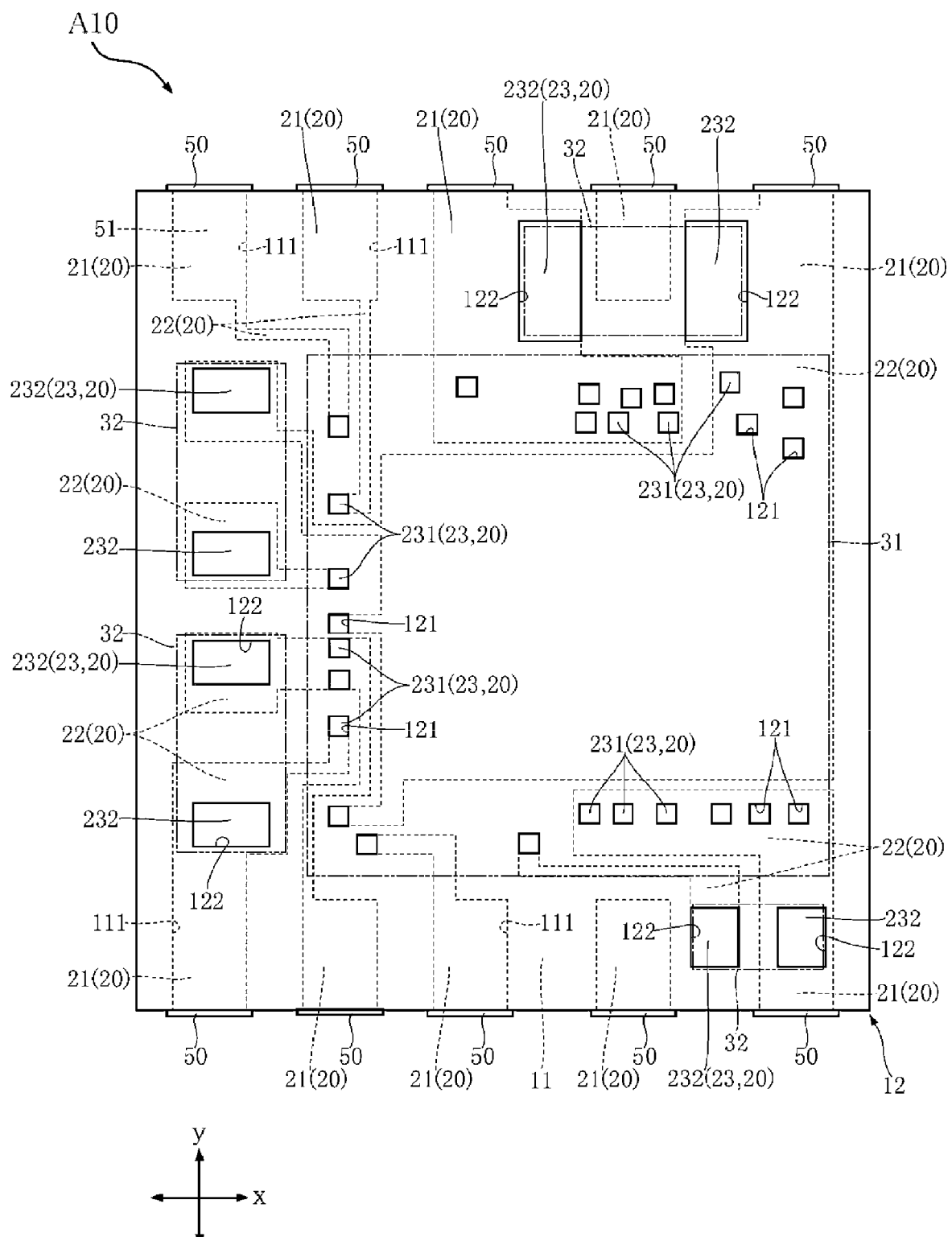
FIG. 2 is a plan view corresponding to FIG. 1, in which a plurality of bonding layers, a semiconductor element, a plurality of electronic components, and a sealing resin are illustrated to be transparent.

A semiconductor device A10 according to a first embodiment of the present disclosure will be described with reference to FIGS. 1 to 10. The semiconductor device A10 includes a first insulating layer 11, a wiring layer 20, a second insulating layer 12, a plurality of bonding layers 39, a semiconductor element 31, a plurality of electronic components 32, a sealing resin 40, and a plurality of terminals 50. The semiconductor device A10 is of a resin package type that is surface-mounted on a wiring board. The package type is a quad flat non-leaded package (QFN) characterized in that a plurality of leads does not protrude from the sealing resin 40. Here, FIG. 1 shows that, for convenience of understanding, the sealing resin 40 is illustrated to be transparent. In FIG. 2, for convenience of understanding, the plurality of bonding layers 39, the semiconductor element 31, and the plurality of electronic components 32 are further illustrated to be transparent through FIG. 1. In FIG. 2, the semiconductor element 31 and plurality of electronic components 32, which are illustrated to be transparent, are shown by imaginary lines (two-dot chain lines).

In the description of the semiconductor device A10, for the sake of convenience, a thickness direction of the wiring layer 20 is referred to as a "thickness direction z." A direction perpendicular to the thickness direction z is referred to as a "first direction x." A direction perpendicular to both the thickness direction z and the first direction x is referred to as a "second direction y." As shown in FIG. 1, the semiconductor device A10 has a rectangular shape when viewed along the thickness direction z.

The wiring layer 20 is disposed on the first insulating layer 11 as shown in FIGS. 3 to 6. The first insulating layer 11 is made of a material containing polyimide. As other materials of the first insulating layer, a material containing an organic compound as a main material, such as a material containing polybenzoxazole, a material containing phenol resin, a material containing polyamide, or the like, may be adopted. Thus, the first insulating layer 11 is made of a material containing an organic compound. The first insulating layer 11 has a plurality of penetrating portions 111. The plurality of penetrating portions 111 penetrates the first insulating layer 11 in the thickness direction z. In the semiconductor device A10, each of the plurality of penetrating portions 111 is opened in one side of the second direction y.

Figure 3:
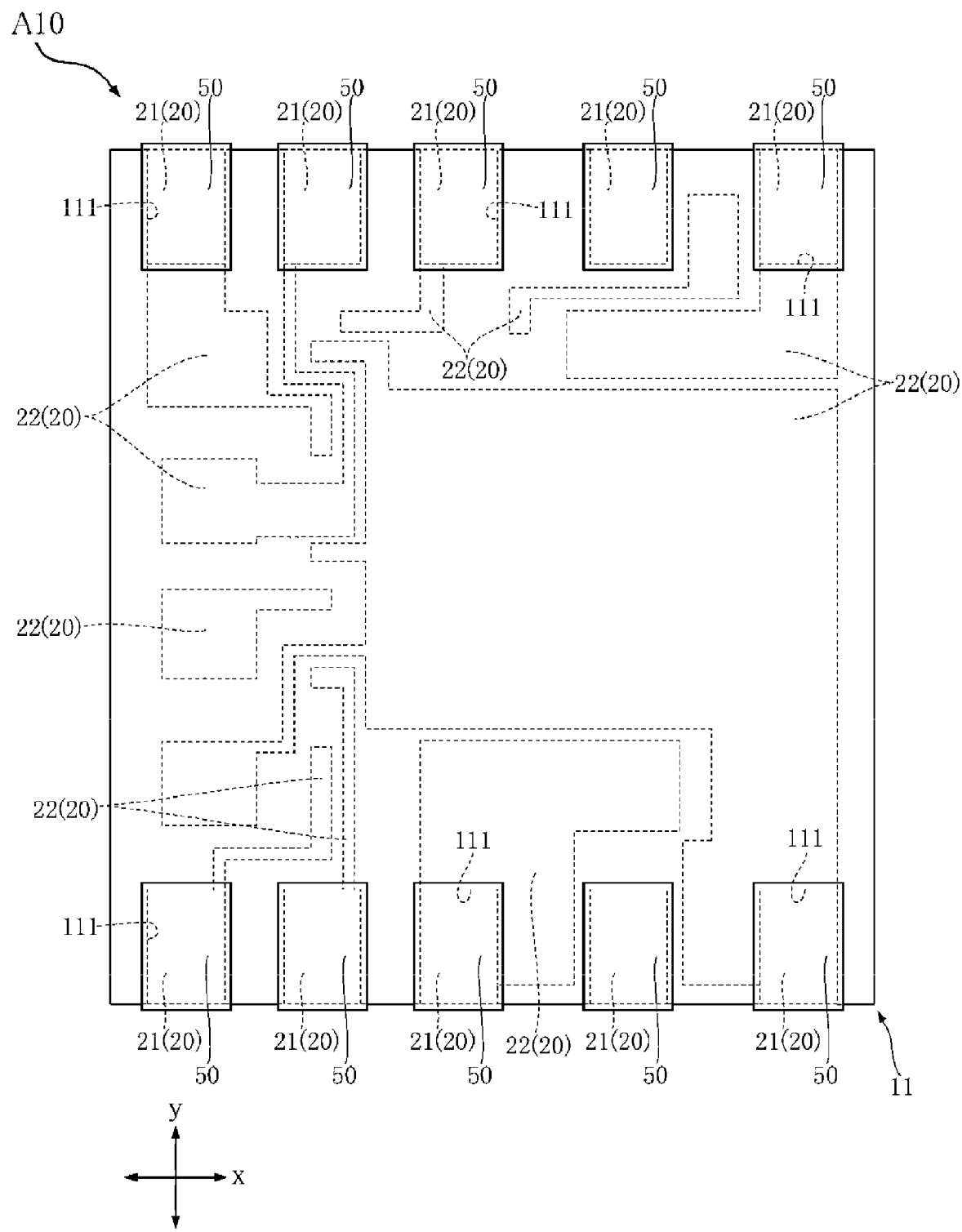
FIG. 3 is a bottom view of the semiconductor device shown in FIG. 1.
Figure 4:
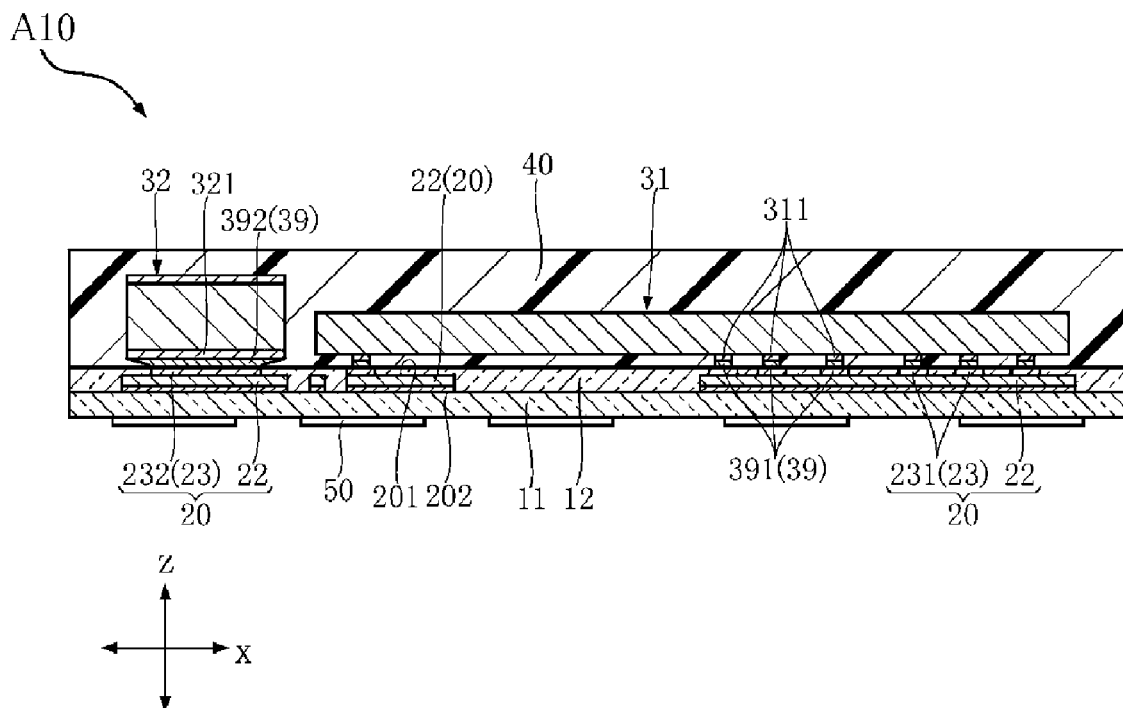
FIG. 4 is a cross-sectional view taken along line IV-IV in FIG. 1.
Figure 5:
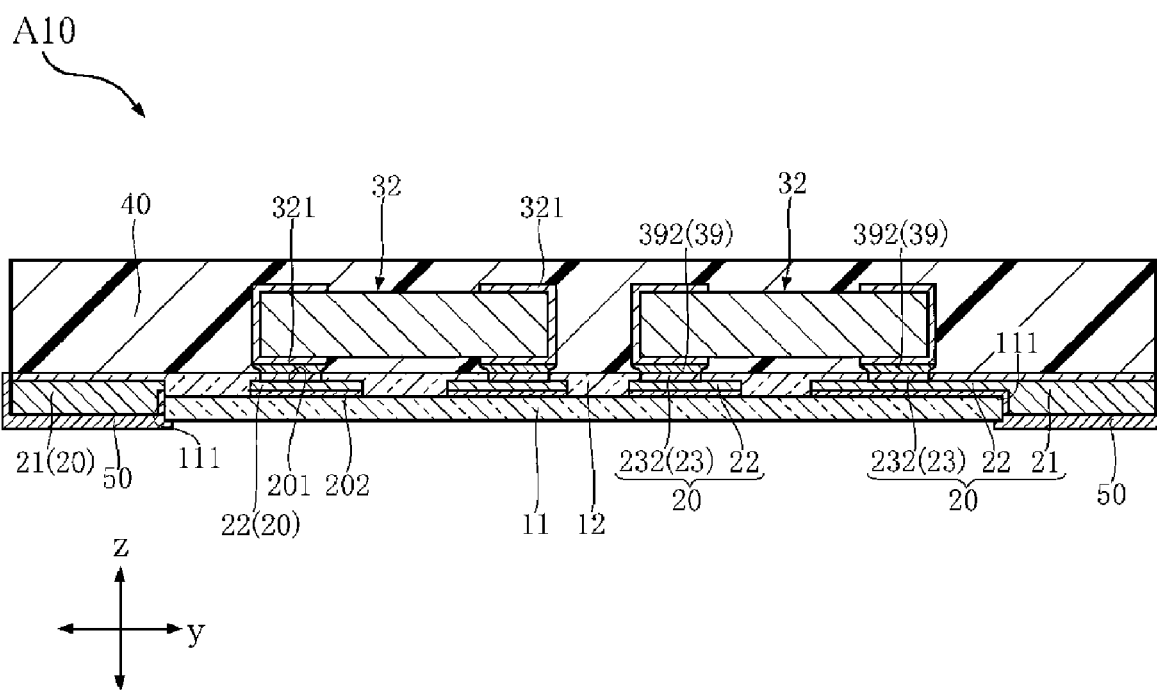
FIG. 5 is a cross-sectional view taken along line V-V in FIG. 1.
Figure 6:
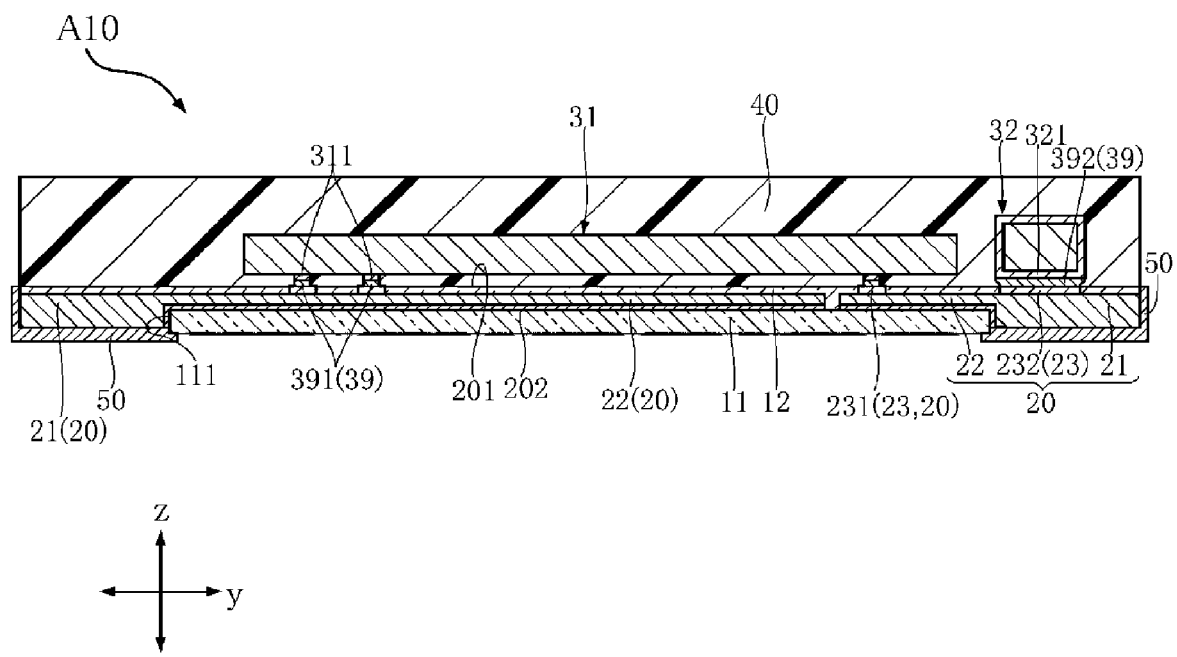
FIG. 6 is a cross-sectional view taken along line VI-VI in FIG. 1.
Figure 7:
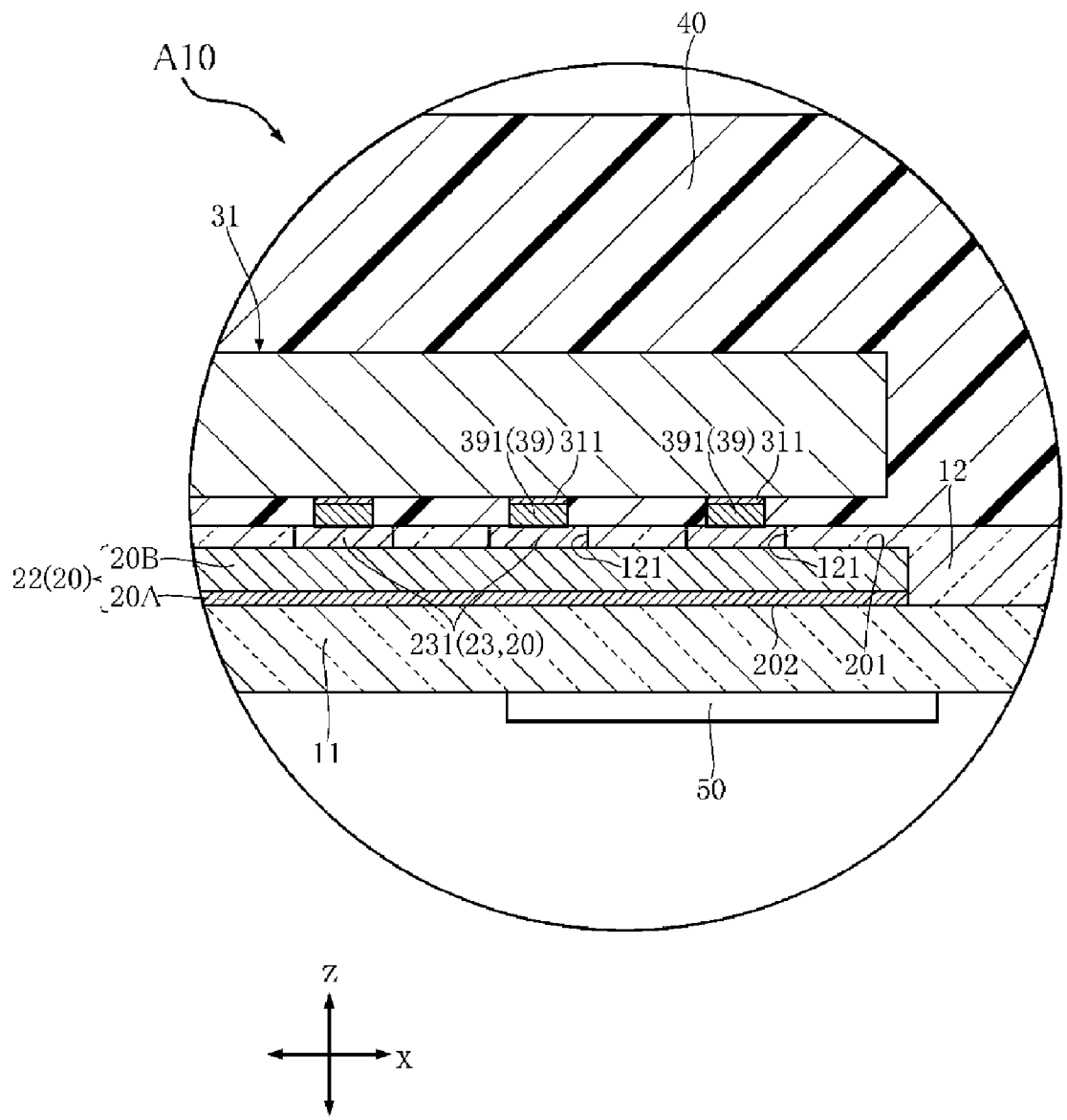
FIG. 7 is a partially enlarged view of FIG. 4.
Figure 8:
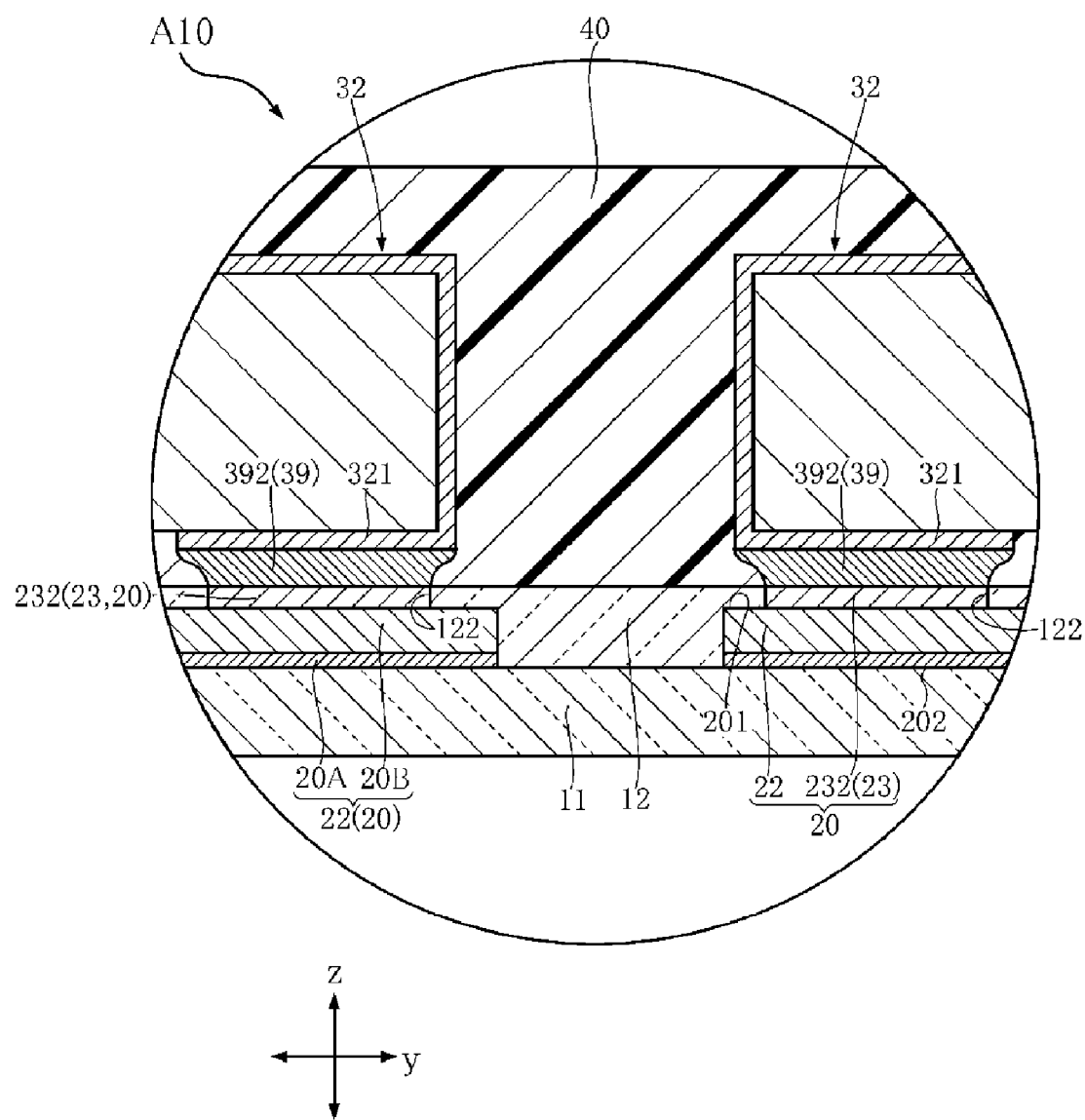
FIG. 8 is a partially enlarged view of FIG. 5.
Figure 9:
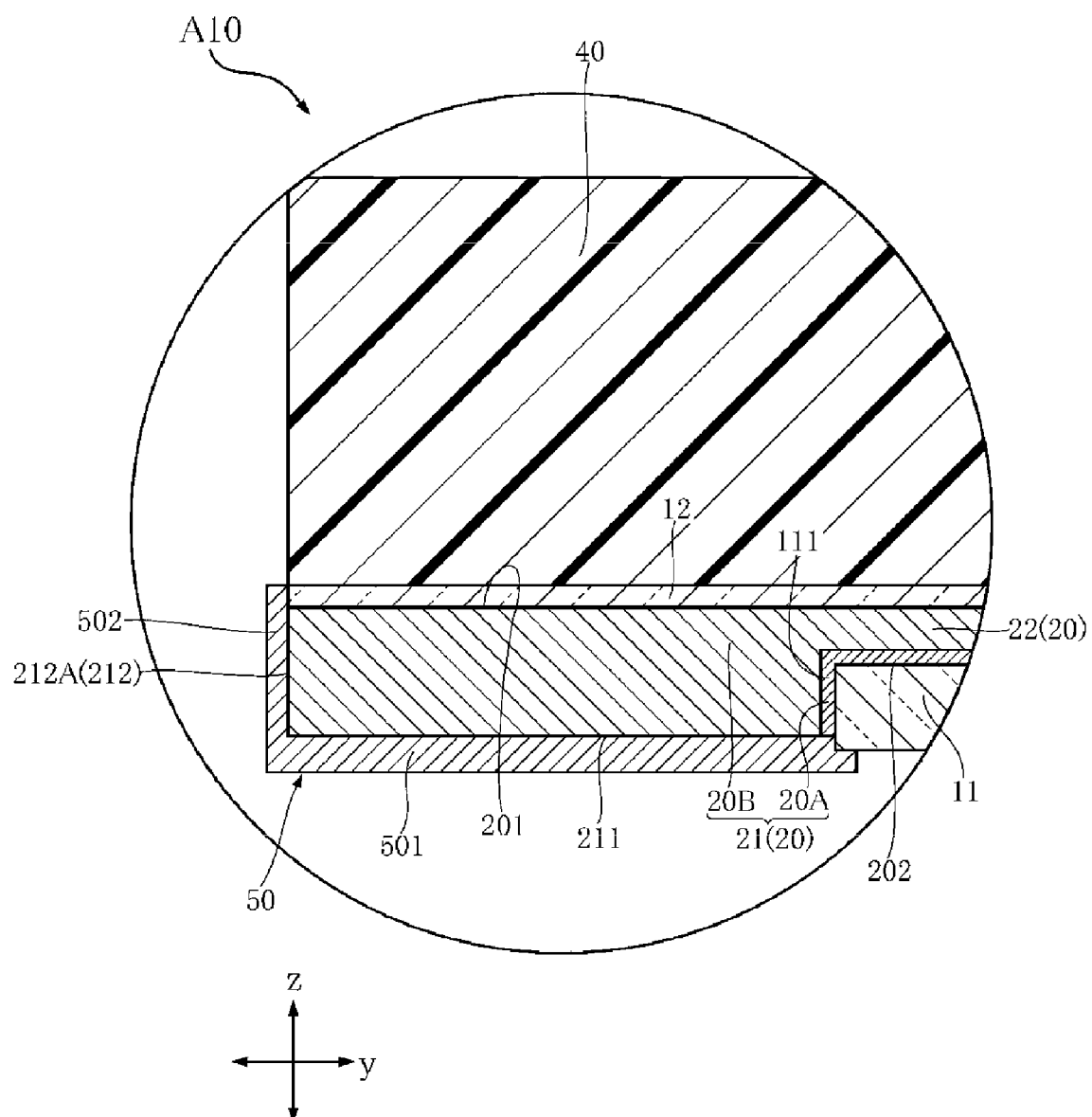
FIG. 9 is a partially enlarged view of FIG. 6.

The wiring layer 20 is arranged on an upper surface of the first insulating layer 11 and the plurality of penetrating portions 111 of the first insulating layer 11, as shown in FIGS. 3 to 6. The wiring layer 20 constitutes a portion of a conductive path between the semiconductor element 31, the plurality of electronic components 32, and the wiring board on which the semiconductor device A10 is mounted. As shown in FIGS. 4 to 6, the wiring layer 20 has a main surface 201 and a rear surface 202 which face opposite sides in the thickness direction z. The main surface 201 faces the semiconductor element 31 and the plurality of electronic components 32. The rear surface 202 is in contact with the upper surface of the first insulating layer 11. The first insulating layer 11 covers the entirety of the rear surface 202. As shown in FIGS. 7 to 9, the wiring layer 20 includes a base layer 20A and a body layer 20B.

The base layer 20A is in contact with the first insulating layer 11. A portion of the base layer 20A is accommodated in each of the plurality of penetrating portions 111 of the first insulating layer 11. The base layer 20A is composed of a barrier layer which is in contact with the first insulating layer 11 and a seed layer which is stacked on the barrier layer. The composition of the barrier layer includes titanium (Ti). The composition of the seed layer includes copper (Cu). The body layer 20B is stacked on the base layer 20A. A portion of the body layer 20B is accommodated in each of the plurality of penetrating portions 111. In the wiring layer 20, the body layer 20B serves as a main conductive path. The body layer 20B is of the same composition as the seed layer of the base layer 20A. Therefore, the composition of the body layer 20B includes copper.

As shown in FIGS. 2, 5, and 6, the wiring layer 20 has a plurality of base portions 21, a plurality of body portions 22, and a plurality of bump portions 23. Among these, the plurality of base portions 21 and the plurality of body portions 22 are composed of the base layer 20A and the body layer 20B, as shown in FIGS. 7 to 9.

As shown in FIG. 3, FIG. 5, and FIG. 6, the plurality of base portions 21 includes portions which are individually accommodated in the plurality of penetrating portions 111 of the first insulating layer 11, and portions which protrude from the upper surface of the first insulating layer 11 in the thickness direction z. When viewed along the thickness direction z, the shape and size of each of the plurality of base portions 21 are equal to the shape and size of any of the plurality of penetrating portions 111 in which a portion of the base portion 21 is accommodated. As shown in FIG. 9, each of the plurality of base portions 21 has the above-mentioned main surface 201, a bottom surface 211, and a side surface 212. The bottom surface 211 faces a side opposite to the main surface 201 and is located farther from the main surface 201 than the rear surface 202 in the thickness direction z. The side surface 212 is connected to the main surface 201 and the bottom surface 211 and is in contact with a surface of the first insulating layer 11 which defines any of the plurality of penetrating portions 111. The side surface 212 of each of the plurality of base portions 21 includes an exposed portion 212A which is exposed from a portion opened in one side of the second direction y in any of the plurality of penetrating portions 111.

As shown in FIGS. 4 to 6, the plurality of body portions 22 are arranged on the upper surface of the first insulating layer 11. Each of the body portions 22 includes the main surface 201 and the rear surface 202 described above. Some of the body portions 22 are connected to any of the base portions 21.

As shown in FIGS. 4 to 8, the plurality of bump portions 23 are arranged on the main surface 201 of the wiring layer 20. The plurality of bump portions 23 protrude from the main surface 201 in the thickness direction z. Each of the plurality of bump portions 23 is in contact with the main surface 201 and is composed of a metal thin film, which contains titanium and copper in its composition, and a copper layer which is stacked on the metal thin film. As shown in FIG. 2, the plurality of bump portions 23 have a rectangular shape when viewed along the thickness direction z. The plurality of bump portions 23 include a plurality of first bump portions 231 and a plurality of second bump portions 232. Each of the plurality of first bump portions 231 is arranged on the main surface 201 of one of the plurality of body portions 22 which form the wiring layer 20. Each of the second bump portions 232 is arranged on the main surface 201 of one of the plurality of base portions 21 and the plurality of body portions 22 which form the wiring layer 20. When viewed along the thickness direction z, an area of each of the plurality of second bump portions 232 is larger than an area of each of the first bump portions 231.

The second insulating layer 12 is in contact with the main surface 201 of the wiring layer 20, as shown in FIGS. 4 to 6. The second insulating layer 12 is made of the same material as the material of the first insulating layer 11. Therefore, the second insulating layer 12 is made of a material containing an organic compound. In the semiconductor device A10, the second insulating layer 12 covers the entirety of the main surface 201. Further, the second insulating layer 12 is in contact with the first insulating layer 11. As shown in FIGS. 2, 7, and 8, the second insulating layer 12 includes a plurality of first openings 121 and a plurality of second openings 122. The plurality of first openings 121 and the plurality of second openings 122 penetrate the second insulating layer 12 in the thickness direction z. The plurality of first bump portions 231 are individually accommodated in the plurality of first openings 121. The plurality of second bump portions 232 are individually accommodated in the plurality of second openings 122.

Figure 10:
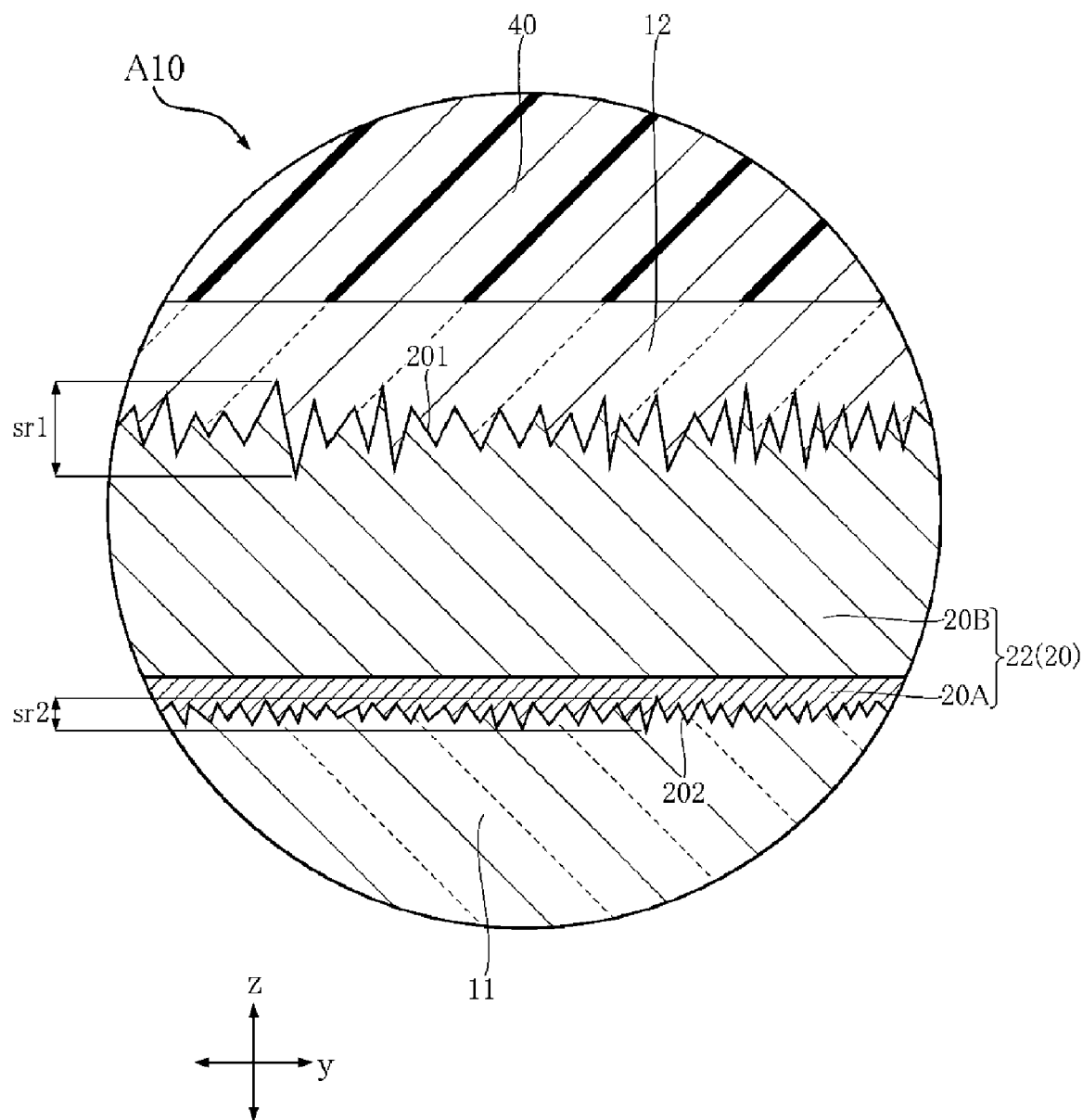
FIG. 10 is a partially enlarged view of FIG. 9.

As shown in FIG. 10, in the wiring layer 20, the surface roughness sr1 of the main surface 201 is larger than the surface roughness sr2 of the rear surface 202. The surface roughness sr1 and surface roughness sr2 of the main surface 201 and the rear surface 202, respectively, are a distance in the thickness direction z between the bottommost portion, which is located inside the wiring layer 20 in the thickness direction z, and the topmost portion, which is located farthest from the bottommost portion in the thickness direction z, in each of the main surface 201 and the rear surface 202.

The bonding layers 39 are individually arranged for the plurality of bump portions 23 of the wiring layer 20, as shown in FIGS. 4 to 8. The plurality of bonding layers 39 protrude from the upper surface of the second insulating layer 12 in the thickness direction z. The plurality of bonding layers 39 have conductivity. Each of the plurality of bonding layers 39 is in contact with any of the plurality of bump portions 23 and includes a metal thin film containing titanium and copper in its composition, a nickel (Ni) layer stacked on the metal thin film, and an alloy layer stacked on the nickel layer and containing tin (Sn) in its composition. The plurality of bonding layers 39 include a plurality of first bonding layers 391 and a plurality of second bonding layers 392. The plurality of first bonding layers 391 are individually arranged for the plurality of first bump portions 231 among the plurality of bump portions 23. The plurality of second bonding layers 392 are individually arranged for the plurality of second bump portions 232 among the plurality of bump portions 23.

The semiconductor element 31 is mounted on the plurality of first bump portions 231 among the plurality of bump portions 23 of the wiring layer 20, as shown in FIGS. 4 to 7 (excluding FIG. 5). The semiconductor element 31 faces the second insulating layer 12. The semiconductor element 31 is a flip-chip mount type element. In an example shown in the semiconductor device A10, the semiconductor element 31 is an LSI. The semiconductor element 31 includes a plurality of pads 311. The plurality of pads 311 are electrically connected to a circuit formed inside the semiconductor element 31. Each of the plurality of pads 311 faces one of the plurality of first bump portions 231. As shown in FIG. 7, each of the plurality of pads 311 is bonded to one of the plurality of first bump portions 231 via one of the plurality of first bonding layers 391 among the plurality of bonding layers 39. As a result, the pads 311 are individually bonded to the plurality of first bump portions 231, so that electrical connection with the wiring layer 20 is secured. Therefore, the semiconductor element 31 is electrically connected to the wiring layer 20.

As shown in FIGS. 2 and 5, each of the plurality of electronic components 32 is mounted on two adjacent second bump portions 232 of the plurality of bump portions 23 of the wiring layer 20. The plurality of electronic components 32 are of a surface mount type and a chip type. Each of the plurality of electronic components 32 corresponds to any one of a diode and a passive element such as a resistor, a capacitor, an inductor, and the like. In the example shown in the semiconductor device A10, when one of the plurality of electronic components 32 is a resistor, it is assumed as a thick film (metal glaze film) type resistor. In addition, when one of the plurality of electronic components 32 is a capacitor, it is assumed as a ceramic capacitor.

As shown in FIGS. 1 and 5, each of the plurality of electronic components 32 has a pair of electrodes 321. The pair of electrodes 321 is located to be spaced apart from each other. As shown in FIG. 8, each of the pair of electrodes 321 of the plurality of electronic components 32 is bonded to one of the plurality of second bump portions 232 via one of the plurality of second bonding layers 392 of the plurality of bonding layers 39. As a result, the pair of electrodes 321 of each of the plurality of electronic components 32 is individually bonded to two adjacent second bump portions 232 of the plurality of second bump portions 232, so that electrical connection with the wiring layer 20 is secured. Therefore, the plurality of electronic components 32 are electrically connected to the wiring layer 20.

As shown in FIGS. 4 to 6, the sealing resin 40 is in contact with the upper surface of the second insulating layer 12. The sealing resin 40 covers the semiconductor element 31 and the plurality of electronic components 32. The sealing resin 40 is made of, for example, an insulating material containing a black epoxy resin.

The plurality of terminals 50 individually cover the bottom surfaces 211 of the plurality of base portions 21 of the wiring layer 20, as shown in FIGS. 3 to 6 (excluding FIG. 4). The plurality of terminals 50 are exposed with respect to the outside of the semiconductor device A10. Each of the plurality of terminals 50 is bonded to a wiring board via a solder, so that the semiconductor device A10 is mounted on the wiring board. In the semiconductor device A10, each of the plurality of terminals 50 is composed of a plurality of metal layers in which a nickel layer, a palladium (Pd) layer, and a gold (Au) layer are sequentially stacked from the bottom surface 211 of one of the base portions 21. Thus, the composition of the plurality of terminals 50 includes nickel, palladium, and gold.

As shown in FIG. 9, each of the plurality of terminals 50 includes a bottom portion 501 and a side portion 502. The bottom portion 501 covers one of the bottom surfaces 211 of the plurality of base portions 21. The side portion 502 is connected to one of the bottom portions 501 of the plurality of terminals 50 and extends from the bottom portion 501 in the thickness direction z. Each of the side portions 502 of the plurality of terminals 50 covers any exposed portion 212A of the plurality of base portions 21 connected to the bottom surfaces 211.

Next, an example of a method of manufacturing the semiconductor device A10 will be described with reference to FIGS. 11 to 26. The cross-sectional positions of FIGS. 11 to 26 (excluding FIG. 17) are the same as the cross-sectional position of FIG. 6.

Figure 11:
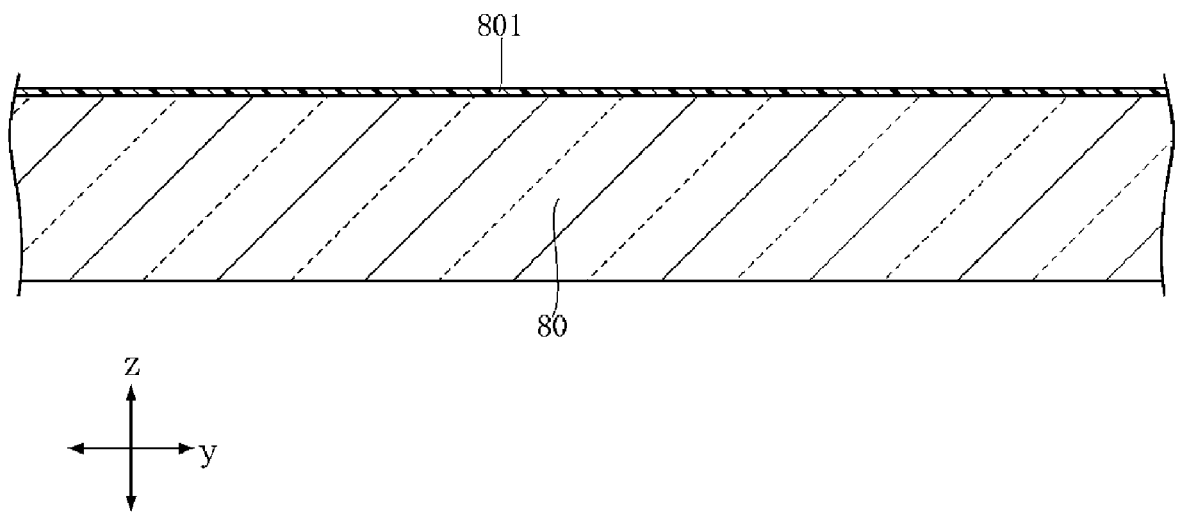
FIG. 11 is a cross-sectional view showing a process of manufacturing the semiconductor device illustrated in FIG. 1.

First, as shown in FIG. 11, a temporary fixing layer 801 is applied to the surface of a base material 80 on one side in the thickness direction z. The base material 80 is a glass plate. The base material 80 may be a silicon wafer other than the glass plate. The temporary fixing layer 801 is made of a material containing an organic compound.

Figure 12:
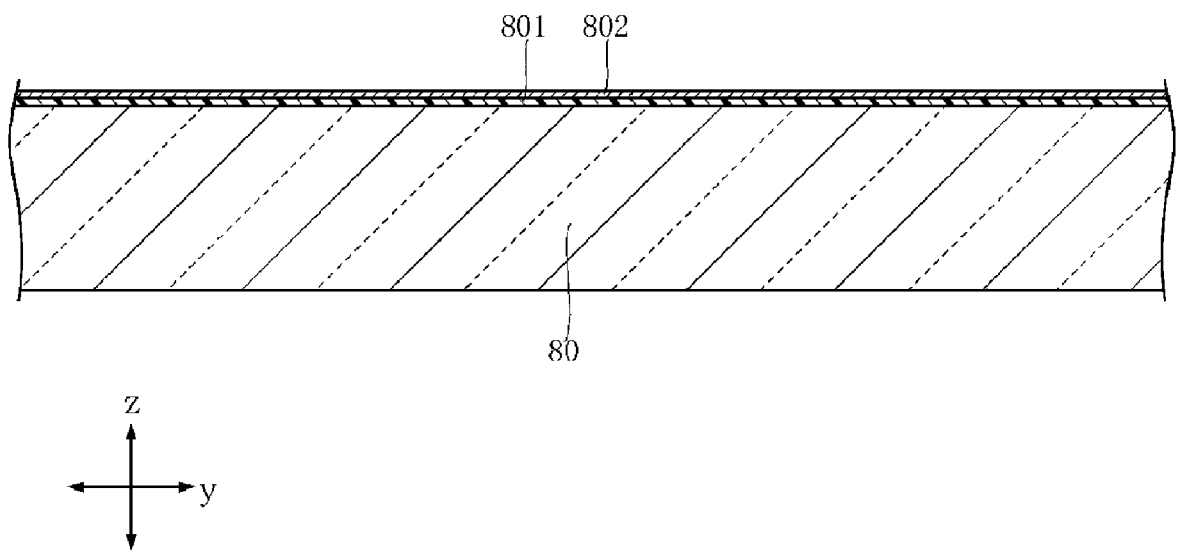
FIG. 12 is a cross-sectional view showing a process of manufacturing the semiconductor device illustrated in FIG. 1.

Next, as shown in FIG. 12, a peeling layer 802 that covers the entirety of the temporary fixing layer 801 is formed. The peeling layer 802 is in contact with the temporary fixing layer 801 and includes a metal thin film made of titanium, and another metal thin film which is stacked on the metal thin film and made of copper. The peeling layer 802 is formed by forming these metal thin films by a sputtering method.

Figure 13:
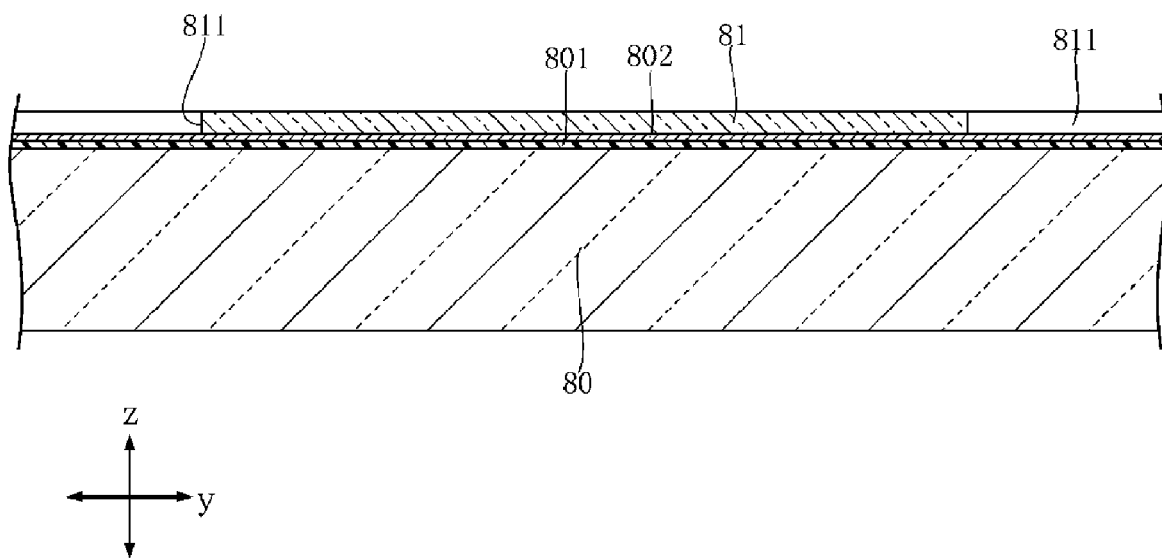
FIG. 13 is a cross-sectional view showing a process of manufacturing the semiconductor device illustrated in FIG. 1.

Next, as shown in FIG. 13, a first insulating layer 81 that covers the peeling layer 802 is formed. The first insulating layer 81 includes a plurality of penetrating portions 811 which penetrates the first insulating layer 81 in the thickness direction z. The first insulating layer 81 is made of a material containing photosensitive polyimide. The first insulating layer 81 is formed by applying the material to the entire peeling layer 802 by using a spin coater or the like and then performing lithographic patterning with respect to the material. As a result, the plurality of penetrating portions 811 are formed in the first insulating layer 81. A portion of the peeling layer 802 is exposed from the plurality of penetrating portions 811.

Figure 14:
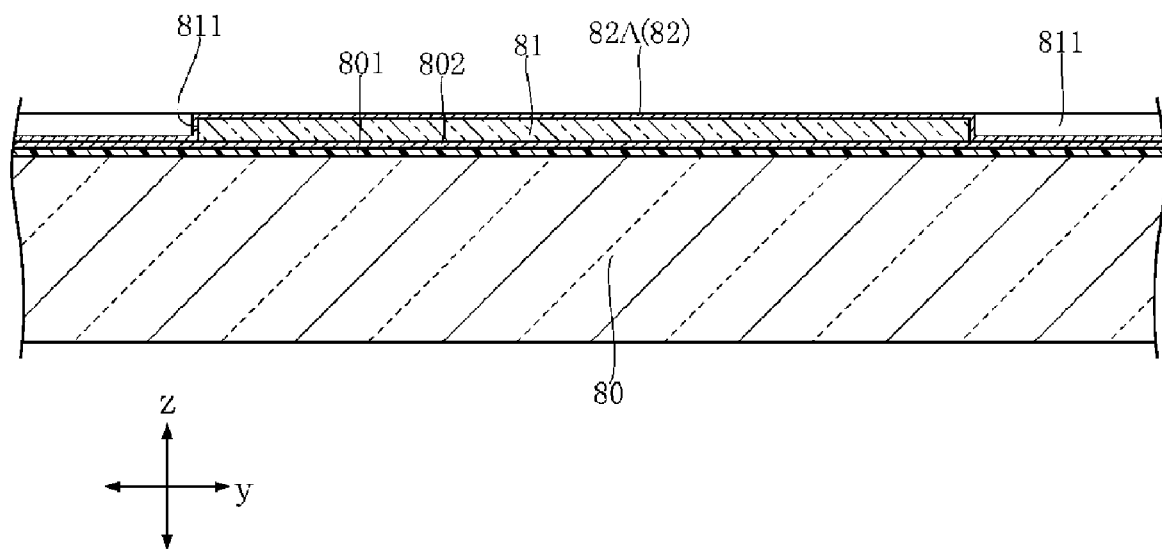
FIG. 14 is a cross-sectional view showing a process of manufacturing the semiconductor device illustrated in FIG. 1.
Figure 15:
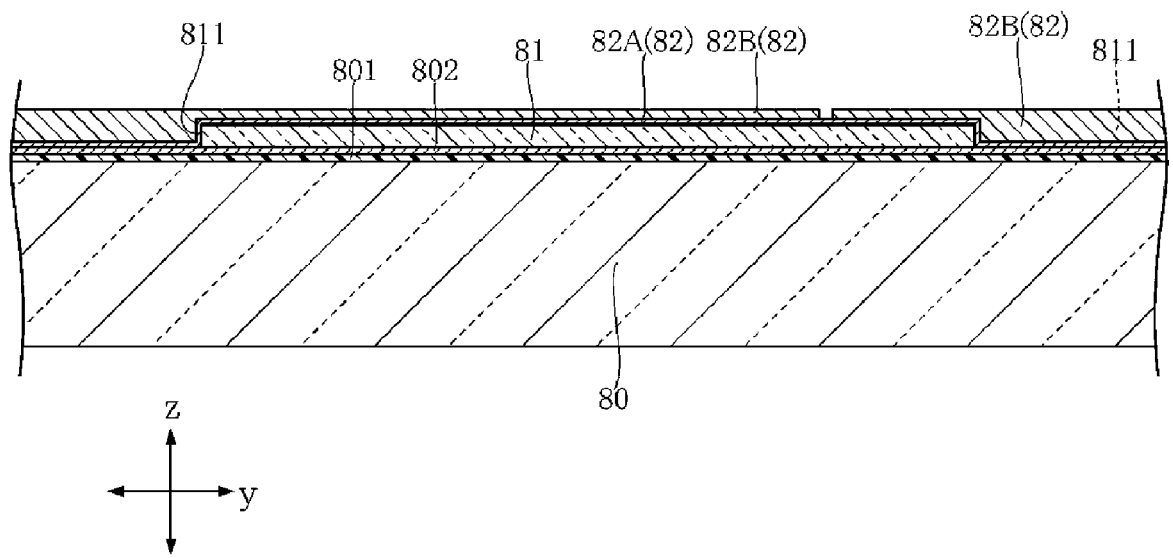
FIG. 15 is a cross-sectional view showing a process of manufacturing the semiconductor device illustrated in FIG. 1.
Figure 16:
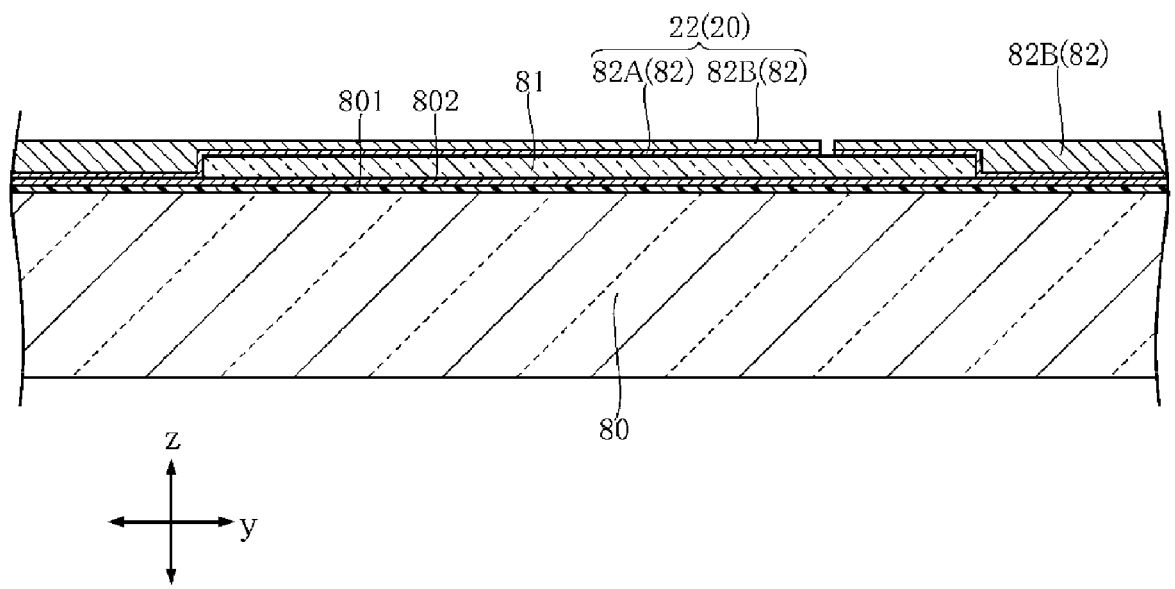
FIG. 16 is a cross-sectional view showing a process of manufacturing the semiconductor device illustrated in FIG. 1.

Next, as shown in FIGS. 14 to 16, a wiring layer 82 is formed on upper surfaces of the first insulating layer 81 and a portion of the peeling layer 802 which is exposed from the plurality of penetrating portions 811 of the first insulating layer 81. A process of forming the wiring layer 82 includes a step of forming a base layer 82A shown in FIG. 14 and a step of forming a plurality of body layers 82B shown in FIG. 15.

First, as shown in FIG. 14, the base layer 82A is formed to cover the first insulating layer 81 and a portion of the peeling layer 802 which is exposed from the plurality of penetrating portions 811 of the first insulating layer 81. The base layer 82A is formed by forming a barrier layer on the entirety of the first insulating layer 81 and the portion of the peeling layer 802, which is exposed from the plurality of penetrating portions 811 of the first insulating layer 81, by a sputtering method, and then forming a seed layer on the entirety of the barrier layer by a sputtering method. The barrier layer is made of titanium having a thickness of 100 nm to 300 nm. The seed layer is made of copper having a thickness of 200 nm to 600 nm.

Next, as shown in FIG. 15, the plurality of body layers 82B are formed on the upper surface of the base layer 82A. The plurality of body layers 82B are made of copper. The plurality of body layers 82B are formed by performing lithographic patterning on the upper surface of the base layer 82A and then performing electrolytic plating using the base layer 82A as a conductive path. Through this step, each of the plurality of penetrating portions 811 of the first insulating layer 81 is filled with the base layer 82A and any of the plurality of body layers 82B.

Next, as shown in FIG. 16, a portion of the base layer 82A is removed. The removal target of the base layer 82A is a portion where the plurality of body layers 82B are not stacked. The base layer 82A is removed by wet etching by using a mixed solution of sulfuric acid ($H_2SO_4$) and hydrogen peroxide ($H_2O_2$). Through this step, formation of the wiring layer 82 is completed. The remaining base layer 82A, which is stacked on the upper surface of the first insulating layer 81, and the portion of the plurality of body layers 82B, which are stacked on the remaining base layer 82A, form the plurality of body portions 22 of the wiring layer 20 of the semiconductor device A10.

Figure 17:
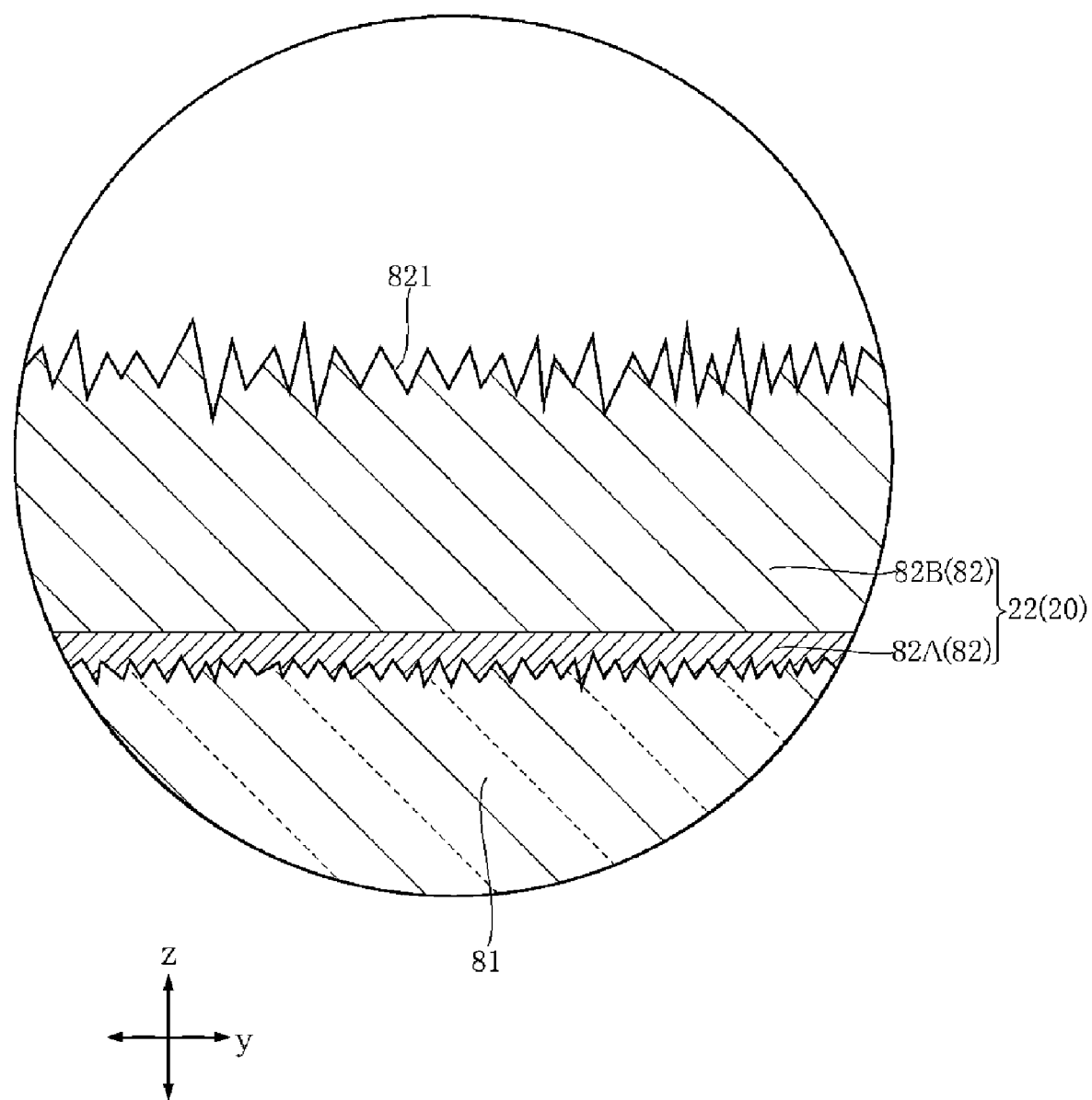
FIG. 17 is a partially enlarged cross-sectional view showing a process of manufacturing the semiconductor device illustrated in FIG. 1.

Next, as shown in FIG. 17, an exposed surface 821 of the wiring layer 82 is roughened by applying a chemical solution. The exposed surface 821 refers to a surface of the wiring layer 82 exposed to the outside in this process. As the chemical solution, either an acidic solution or an alkaline solution is selected. An example of the acidic solution is a mixed solution of sulfuric acid and hydrogen peroxide. An example of the alkaline solution is an aqueous solution of ammonium formate ($NH_4HCO_2$). When the acidic solution is selected from these, the exposed surface 821 may be roughened together with the removal of the base layer 82A in the step of removing a portion of the base layer 82A shown in FIG. 16.

Figure 18:
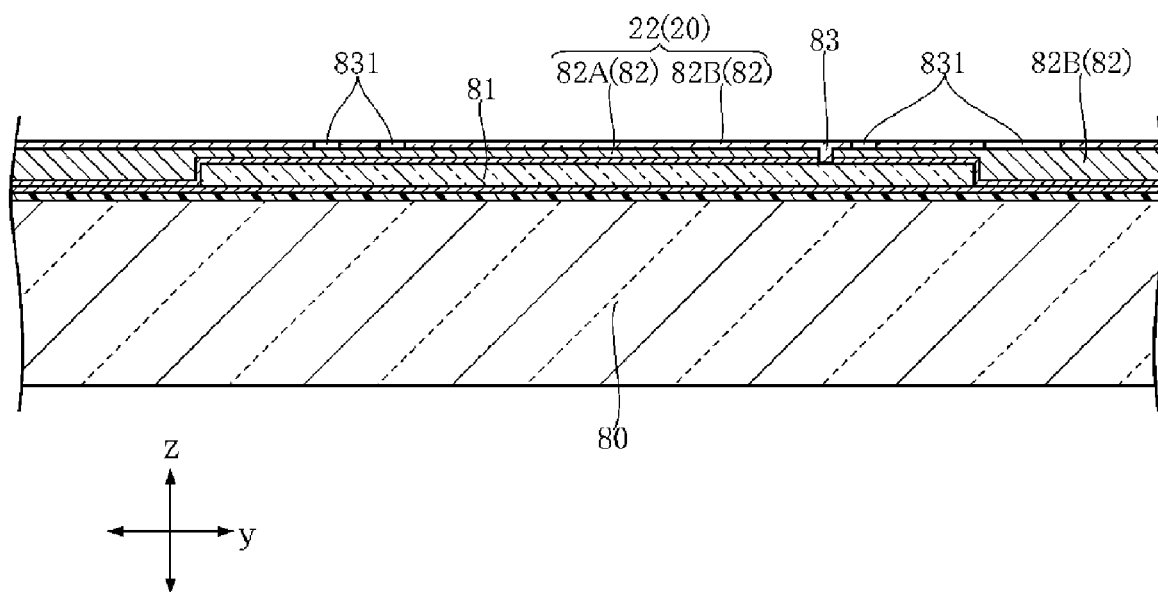
FIG. 18 is a cross-sectional view showing a process of manufacturing the semiconductor device illustrated in FIG. 1.

Next, as shown in FIG. 18, a second insulating layer 83 is formed to cover the wiring layer 82 and a portion of the first insulating layer 81. The second insulating layer 83 includes a plurality of openings 831 which penetrate the second insulating layer 83 in the thickness direction z. The second insulating layer 83 is made of a material containing photosensitive polyimide. The second insulating layer 83 is formed by applying the material on the entirety of the portion of the first insulating layer 81 and the surface of the wiring layer 82 by using a spin coater or the like, and then performing lithographic patterning with respect to the material. As a result, the plurality of openings 831 are formed in the second insulating layer 83. A portion of the body layers 82B of the wiring layer 82 is exposed from the plurality of openings 831.

Figure 19:
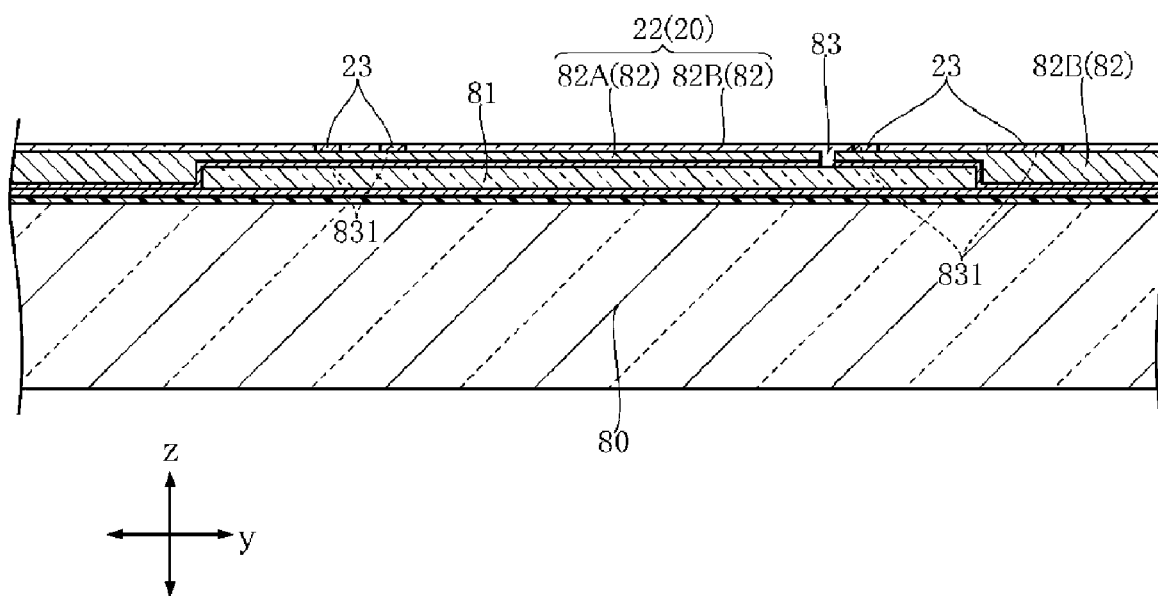
FIG. 19 is a cross-sectional view showing a process of manufacturing the semiconductor device illustrated in FIG. 1.

Next, as shown in FIG. 19, the plurality of bump portions 23 (a portion of the wiring layer 20 of the semiconductor device A10) individually accommodated in the openings 831 of the second insulating layer 83 are formed. In forming the plurality of bump portions 23, first, a metal thin film having the same configuration as the base layer 82A is formed on the entirety of the second insulating layer 83 and the portion of the body layers 82B of the wiring layer 82 which is exposed from the plurality of openings 831, by a sputtering method. Subsequently, a copper layer is formed on the upper surface of the metal thin film by electrolytic plating using the metal thin film as a conductive path. Finally, the metal thin film and the copper layer, which are located on the upper surface of the second insulating layer 83, are removed by wet etching. With the above, formation of the plurality of bump portions 23 is completed.

Figure 20:
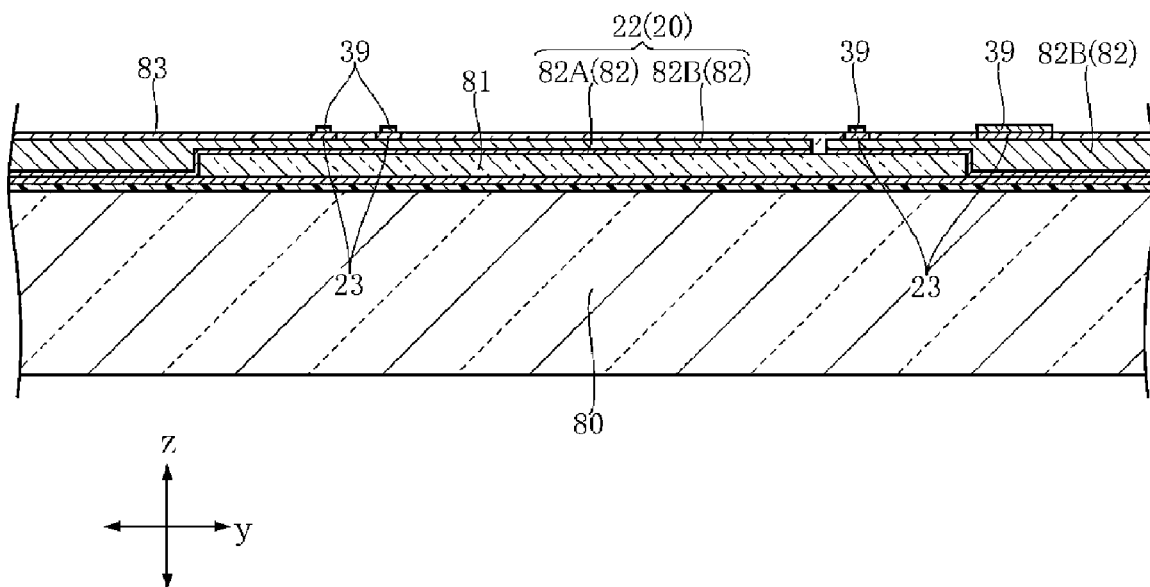
FIG. 20 is a cross-sectional view showing a process of manufacturing the semiconductor device illustrated in FIG. 1.

Next, as shown in FIG. 20, the plurality of bonding layers 39 are individually formed on the upper surfaces of the plurality of bump portions 23. In forming the plurality of bonding layers 39, first, lithographic patterning is performed with respect to the upper surfaces of the second insulating layer 83 and the plurality of bump portions 23. As a result, a portion of each of the plurality of bump portions 23 is exposed from the lithographic patterning. Subsequently, a metal thin film having the same configuration as the base layer 82A is formed on the entirety of patterns by the lithographic patterning and a portion of the plurality of bump portions 23 exposed from the lithographic patterning, by a sputtering method. Thereafter, a nickel layer and an alloy layer containing tin are sequentially formed on the metal thin film by electrolytic plating using the metal thin film as a conductive path. Finally, the lithographic pattern and the metal thin film, the nickel layer, and the alloy layer, which are stacked on the upper surface of the lithographic pattern, are removed by lift-off. With the above, formation of the plurality of bonding layers 39 is completed.

Figure 21:
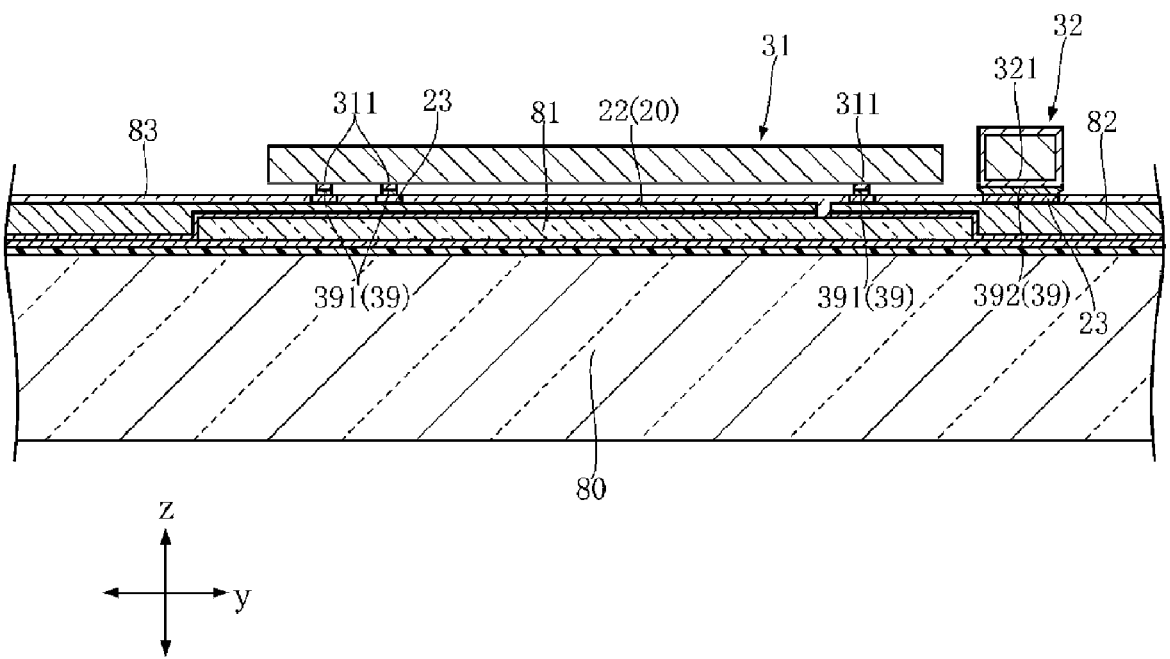
FIG. 21 is a cross-sectional view showing a process of manufacturing the semiconductor device illustrated in FIG. 1.

Next, as shown in FIG. 21, the semiconductor element 31 and the plurality of electronic components 32 are bonded to the plurality of bump portions 23 via the plurality of bonding layers 39. The semiconductor element 31 is bonded to the plurality of bump portions 23 by flip-chip bonding. First, each of the pair of electrodes 321 of the plurality of electronic components 32 is temporarily attached to one of the plurality of second bonding layers 392 among the plurality of bonding layers 39. Thereafter, the plurality of pads 311 of the plurality of semiconductor elements 31 is individually attached temporarily to the plurality of first bonding layers 391 among the plurality of bonding layers 39 by using a collet. Subsequently, the plurality of bonding layers 39 are melted by reflow. Finally, the plurality of molten bonding layers 39 are solidified by cooling, so that the bonding of the semiconductor element 31 and the electronic components 32 to the plurality of bump portions 23 is completed.

Figure 22:
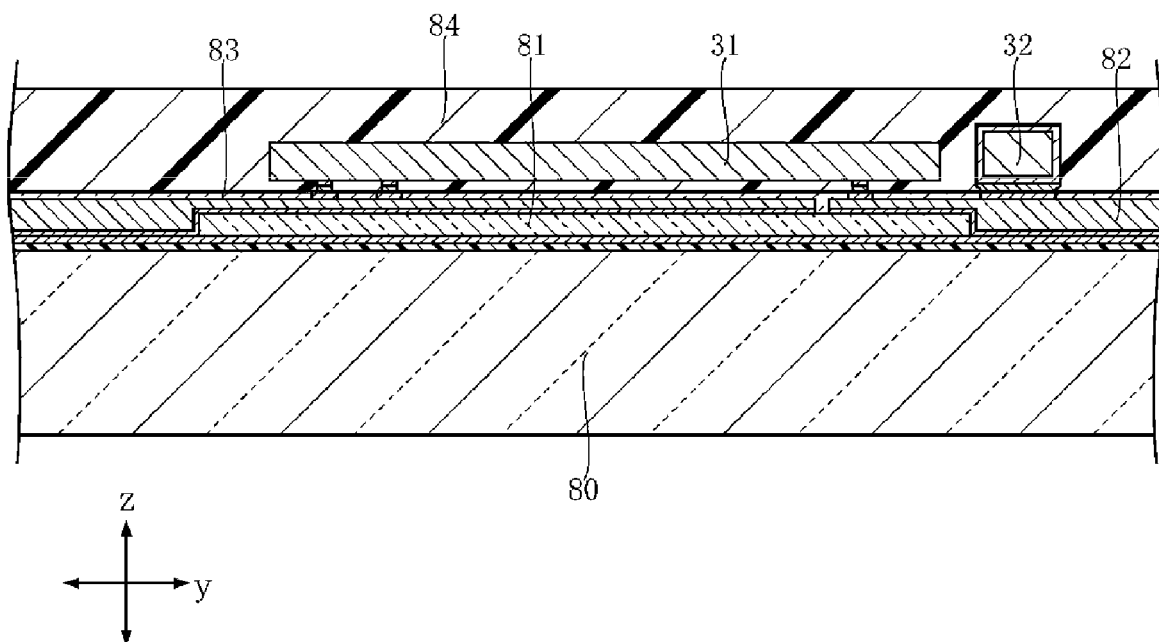
FIG. 22 is a cross-sectional view showing a process of manufacturing the semiconductor device illustrated in FIG. 1.

Next, as shown in FIG. 22, a sealing resin 84 is formed to be in contact with the second insulating layer 83. The sealing resin 84 is made of a material containing black epoxy resin. The sealing resin 84 is formed by compression molding. Through this step, the semiconductor element 31 and the plurality of electronic components 32 are covered with the sealing resin 84.

Figure 23:
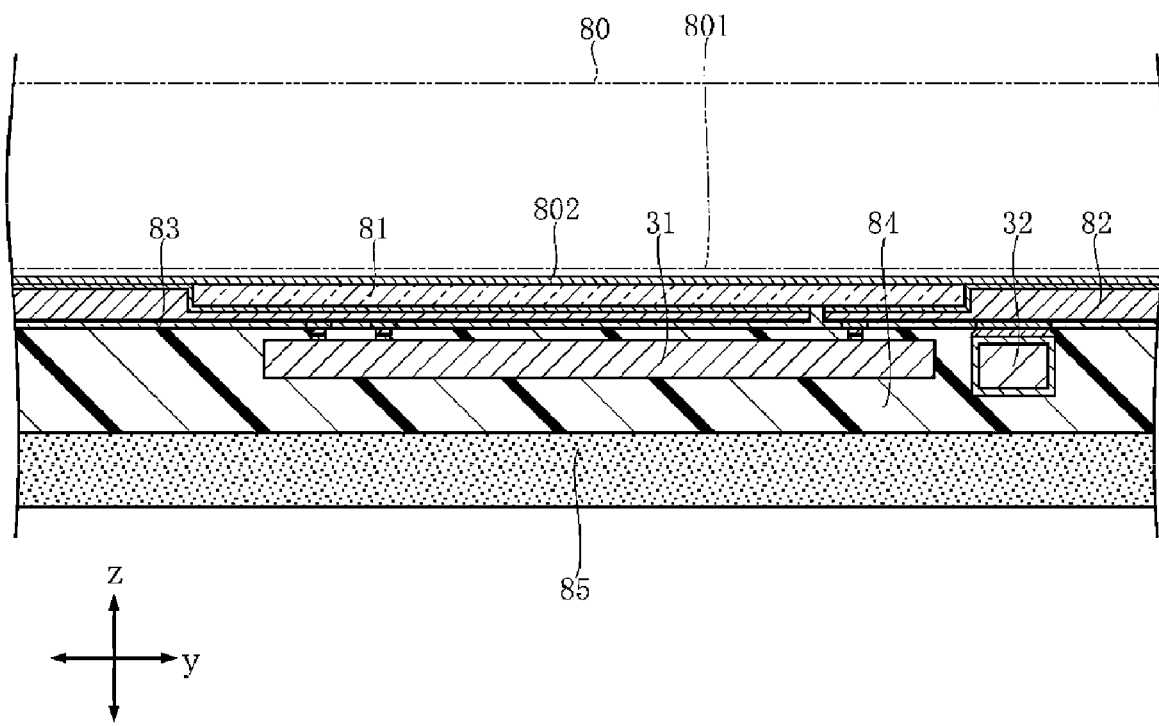
FIG. 23 is a cross-sectional view showing a process of manufacturing the semiconductor device illustrated in FIG. 1.

Next, as shown in FIG. 23, after a tape 85 is attached to the surface of the sealing resin 84 which faces the thickness direction z, the base material 80 and the temporary fixing layer 801 are removed. First, the tape 85 is attached to the surface of the sealing resin 84. The tape 85 is a dicing tape. The tape 85 is located on a side of the sealing resin 84 which is opposite the first insulating layer 81 and the second insulating layer 83 in the thickness direction z. Subsequently, the base material 80 is irradiated with a laser. This weakens the bonding between the base material 80 and the temporary fixing layer 801, so that the base material 80 can be peeled off from the temporary fixing layer 801. Finally, the temporary fixing layer 801 is irradiated with plasma, so that the temporary fixing layer 801 attached to the peeling layer 802 is removed.

Figure 24:
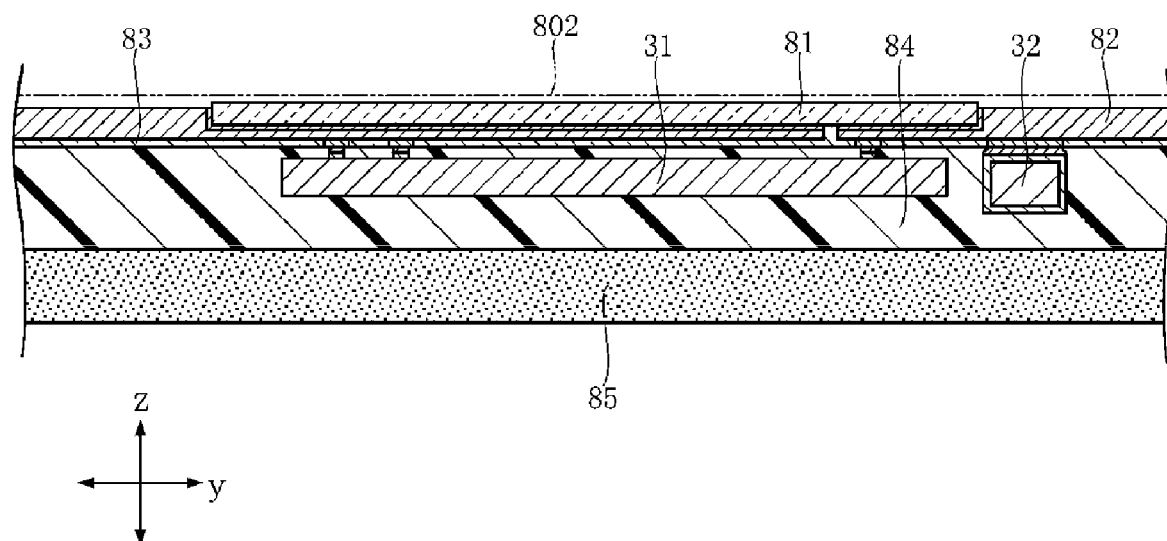
FIG. 24 is a cross-sectional view showing a process of manufacturing the semiconductor device illustrated in FIG. 1.

Next, as shown in FIG. 24, the peeling layer 802 is removed. The peeling layer 802 is removed by wet etching using a mixed solution of sulfuric acid and hydrogen peroxide. Through this step, a portion of the wiring layer 82 can be visually recognized from the first insulating layer 81.

Figure 25:
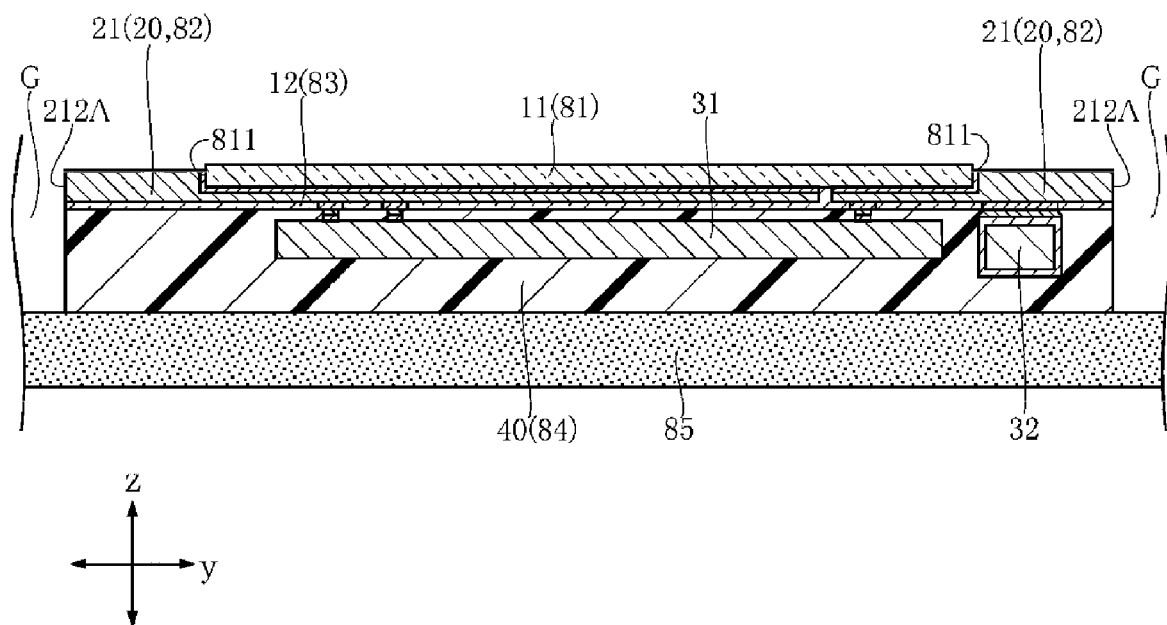
FIG. 25 is a cross-sectional view showing a process of manufacturing the semiconductor device illustrated in FIG. 1.

Next, as shown in FIG. 25, the first insulating layer 81, the wiring layer 82 located in the plurality of penetrating portions 811 of the first insulating layer 81, the second insulating layer 83, and the sealing resin 84 are cut in the form of a lattice along both the first direction x and the second direction y to be divided into a plurality of segments. A dicing blade or the like is used for cutting. However, the tape 85 is not cut in this step. Therefore, a groove G is formed between two adjacent segments. Through this step, the first insulating layer 81, the second insulating layer 83, and the sealing resin 84, which have been individually segmented, become the first insulating layer 11, the second insulating layer 12, and the sealing resin 40, respectively, of the semiconductor device A10. In addition, the wiring layers 82 located in the plurality of penetrating portions 811 of the segmented first insulating layer 81 become the plurality of base portions 21 of the wiring layer 20 of the semiconductor device A10. Through this step, the exposed portions 212A of the plurality of base portions 21 can be visually recognized from the sealing resin 40.

Figure 26:
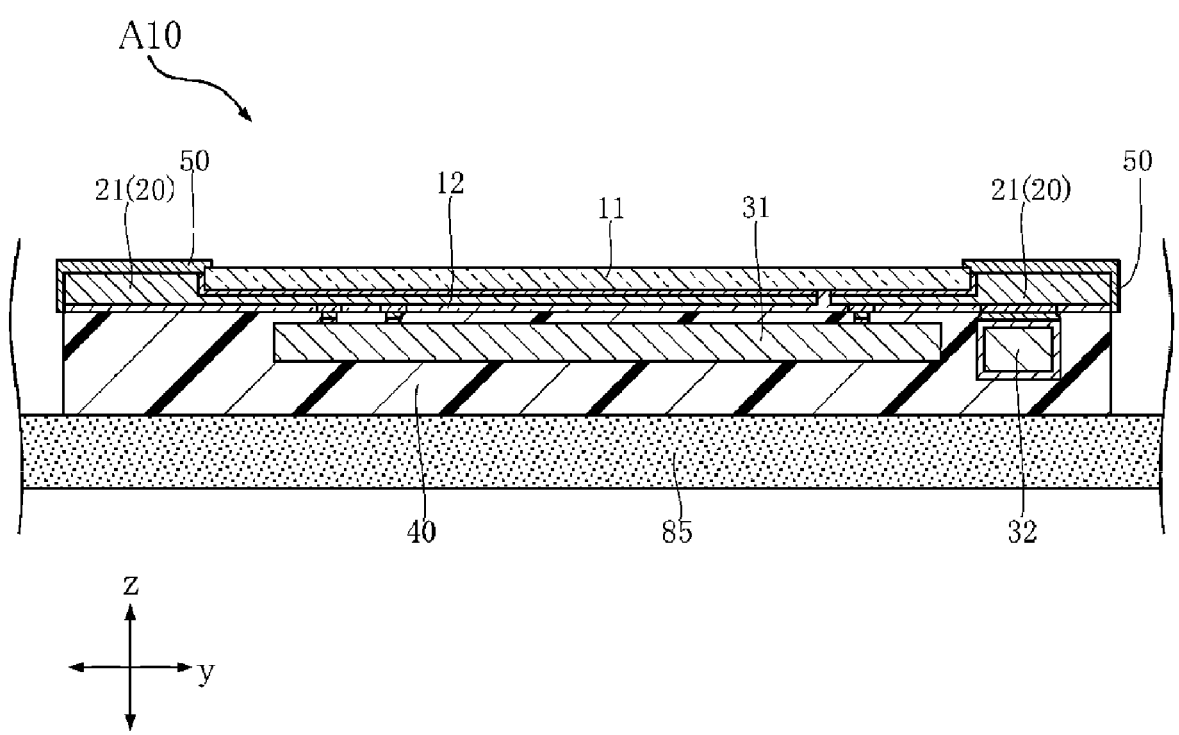
FIG. 26 is a cross-sectional view showing a process of manufacturing the semiconductor device illustrated in FIG. 1.

Finally, as shown in FIG. 26, the plurality of terminals 50 are formed to individually cover a portion of each of the plurality of base portions 21 of the wiring layer 20. The plurality of terminals 50 are formed by electroless plating. Through the above steps, the semiconductor device A10 is manufactured.

Next, the operation and effects of the semiconductor device A10 will be described.

The semiconductor device A10 includes the wiring layer 20 having the main surface 201 and the rear surface 202, the first insulating layer 11 covering the entirety of the rear surface 202, the second insulating layer 12 in contact with the main surface 201, the semiconductor element 31 which faces the second insulating layer 12 and is mounted on the wiring layer 20, and the sealing resin 40 covering the semiconductor element 31. The main surface 201 and the rear surface 202 face opposite sides to each other in the thickness direction z. As shown in FIG. 10, the surface roughness sr1 of the main surface 201 is larger than the surface roughness sr2 of the rear surface 202. As a result, the surface area per unit area of the main surface 201 (the unit area viewed along the thickness direction z) becomes larger than the surface area per unit area of the rear surface 202. Therefore, the area of the second insulating layer 12, which is in contact with the main surface 201, can be increased. Further, the anchoring effect of the second insulating layer 12 on the main surface 201 becomes greater. Therefore, according to the semiconductor device A10, the adhesion between the wiring layer 20 and the insulating layer (the second insulating layer 12) covering the wiring layer 20 can be further improved.

The second insulating layer 12 has the plurality of first openings 121 which penetrate in the thickness direction z. The wiring layer 20 includes the plurality of first bump portions 231 which protrude from the main surface 201 in the thickness direction z. The plurality of first bump portions 231 are individually accommodated in the plurality of first openings 121. The plurality of pads 311 of the semiconductor element 31 are individually bonded to the plurality of first bump portions 231. As a result, a leakage current at the boundary between the plurality of pads 311 and the wiring layer 20 can be suppressed more effectively.

The second insulating layer 12 covers the entirety of the main surface 201 of the wiring layer 20. As a result, a leakage current from the wiring layer 20 can be suppressed more effectively. Further, by adopting a configuration in which the second insulating layer 12 is in contact with the first insulating layer 11, the effect of suppressing the leakage current is further improved.

The semiconductor device A10 further includes the plurality of electronic components 32 having the pair of electrodes 321. The wiring layer 20 includes the plurality of second bump portions 232 which protrude from the main surface 201 in the thickness direction z. The pair of electrodes 321 of each of the plurality of electronic components 32 is individually bonded to two adjacent second bump portions 232 among the plurality of second bump portions 232. As a result, the plurality of electronic components 32 can control voltage adjustment of electric signals which are input to the semiconductor element 31. Therefore, the number of electronic components, which are mounted on the wiring board together with the semiconductor device A10, can be reduced.

The second insulating layer 12 has the plurality of second openings 122 which penetrate in the thickness direction z. The plurality of second bump portions 232 are individually accommodated in the plurality of second openings 122. As a result, a leakage current at the boundary between the wiring layer 20 and the pair of electrodes 321 of the plurality of electronic components 32 can be suppressed more effectively.

The first insulating layer 11 includes the plurality of penetrating portions 111 which penetrate in the thickness direction z. The wiring layer 20 includes the plurality of base portions 21 which include portions individually accommodated in the plurality of penetrating portions 111. Each of the plurality of base portions 21 includes the bottom surface 211 and the side surface 212. The side surface 212 of each of the plurality of base portions 21 includes the exposed portion 212A, which is exposed from any of the penetrating portions 111. The semiconductor device A10 further includes the plurality of terminals 50 that individually cover the bottom surfaces 211 of the plurality of base portions 21. The plurality of terminals 50 include the bottom portion 501 that covers the bottom surface 211 of any of the base portions 21, and the side portion 502 that covers the exposed portion 212A of any of the plurality of base portions 21 connected to the bottom surface 211. As a result, when the semiconductor device A10 is mounted on the wiring board by solder, the solder adheres not only to the bottom portion 501 but also to the side portion 502 in each of the plurality of terminals 50. Therefore, the mounting strength of the semiconductor device A10 on the wiring board can be improved.

Second Embodiment

A semiconductor device A20 according to a second embodiment of the present disclosure will be described with reference to FIGS. 27 to 31. In these figures, the same or similar elements as those of the semiconductor device A10 described above are denoted by the same reference numerals, and a repeated explanation thereof will be omitted. Here, in FIG. 27, for convenience of understanding, the sealing resin 40 is illustrated to be transparent.

The semiconductor device A20 is different from the above-described semiconductor device A10 in the configurations of the second insulating layer 12, the wiring layer 20, and the plurality of terminals 50.

Figure 27:
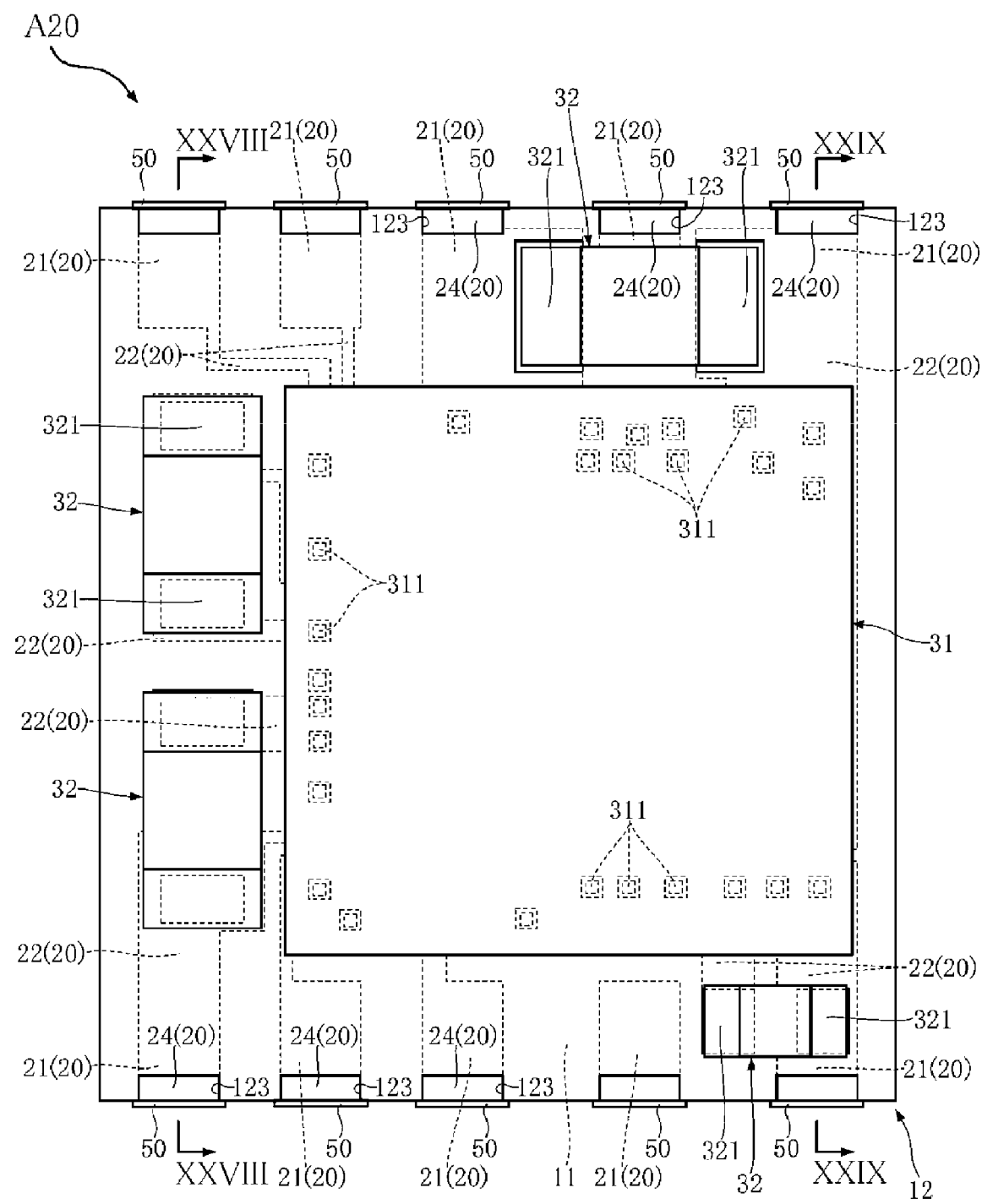
FIG. 27 is a plan view of a semiconductor device according to a second embodiment of the present disclosure, in which a sealing resin is illustrated to be transparent.
Figure 30:
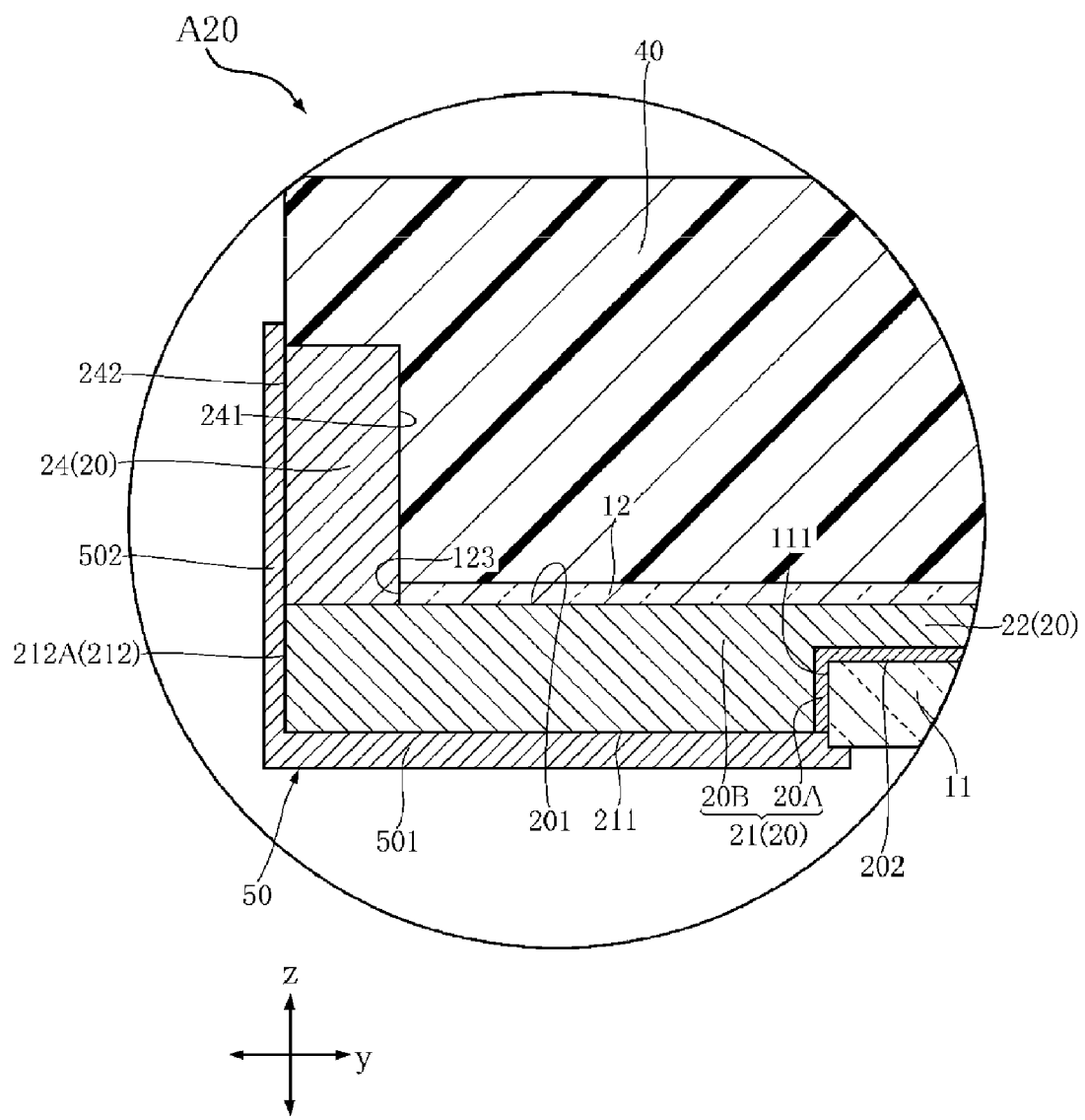
FIG. 30 is a partially enlarged view of FIG. 29.

As shown in FIGS. 27 and 30, in the semiconductor device A20, the second insulating layer 12 further includes a plurality of third openings 123 in addition to the plurality of first openings 121 and the plurality of second openings 122 described above. The plurality of third openings 123 penetrates the second insulating layer 12 in the thickness direction z. When viewed along the thickness direction z, each of the plurality of third openings 123 has a rectangular shape, and overlap both of any of the plurality of penetrating portions 111 of the first insulating layer 11 and any of the plurality of base portions 21 of the wiring layer 20 including a portion accommodated in the penetrating portion 111.

Figure 28:
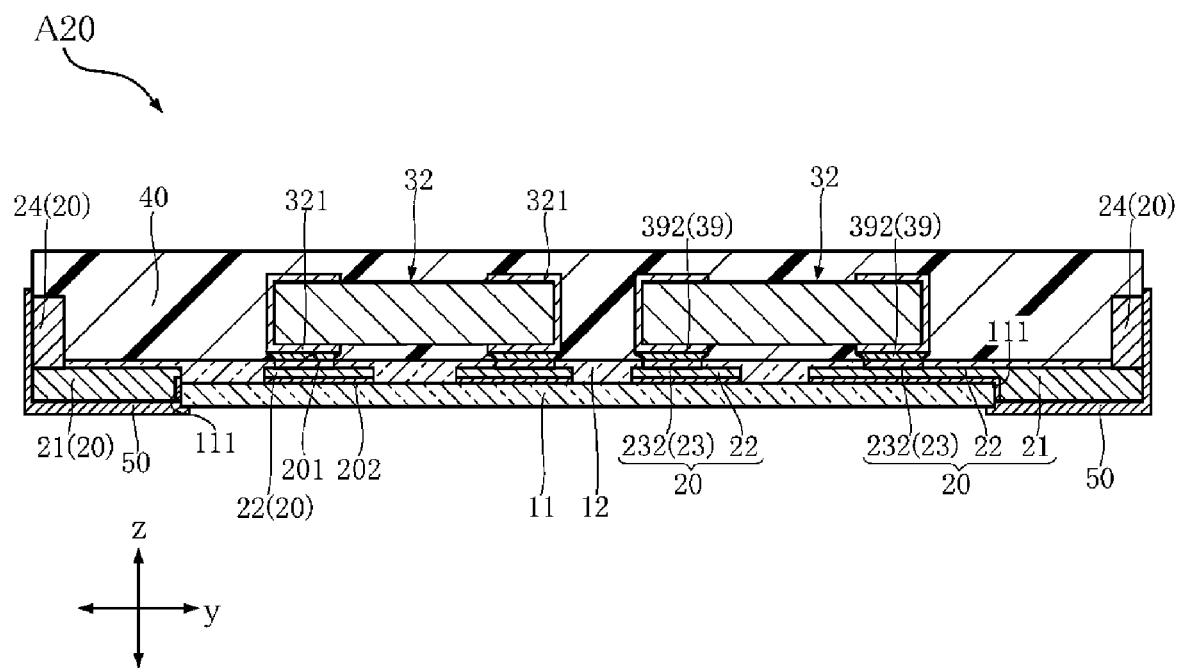
FIG. 28 is a cross-sectional view taken along line XXVIII-XXVIII in FIG. 27.
Figure 29:
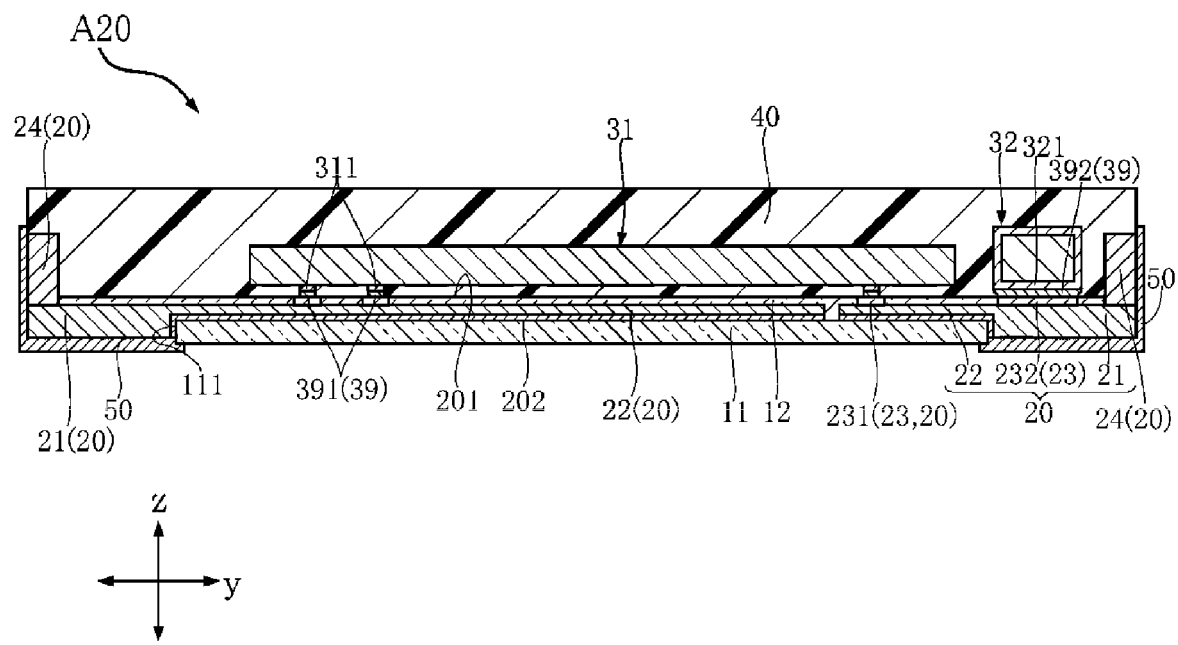
FIG. 29 is a cross-sectional view taken along line XXIX-XXIX in FIG. 27.

As shown in FIGS. 27 to 29, in the semiconductor device A20, the wiring layer 20 includes a plurality of columnar portions 24. Each of the plurality of columnar portions 24 extends from the main surface 201 of any of the plurality of base portions 21 of the wiring layer 20 in the thickness direction z. A portion of each of the plurality of columnar portions 24 is accommodated in any of the plurality of third openings 123 of the second insulating layer 12. The composition of the columnar portions 24 is the same as the composition of the body layer 20B which forms the wiring layer 20. Therefore, the composition of the columnar portions 24 contains copper.

As shown in FIG. 30, each of the plurality of columnar portions 24 has an inner side surface 241 and an outer side surface 242. The inner side surface 241 faces the semiconductor element 31. The inner side surface 241 is in contact with both the sealing resin 40 and the second insulating layer 12. The outer side surface 242 faces the side opposite to the inner side surface 241. The outer side surface 242 is exposed from the sealing resin 40. The outer side surface 242 is flush with any exposed portion 212A of the plurality of base portions 21 of the wiring layer 20. The side portion 502 of each of the plurality of terminals 50 covers the outer side surface 242 of any of the plurality of columnar portions 24.

Figure 31:
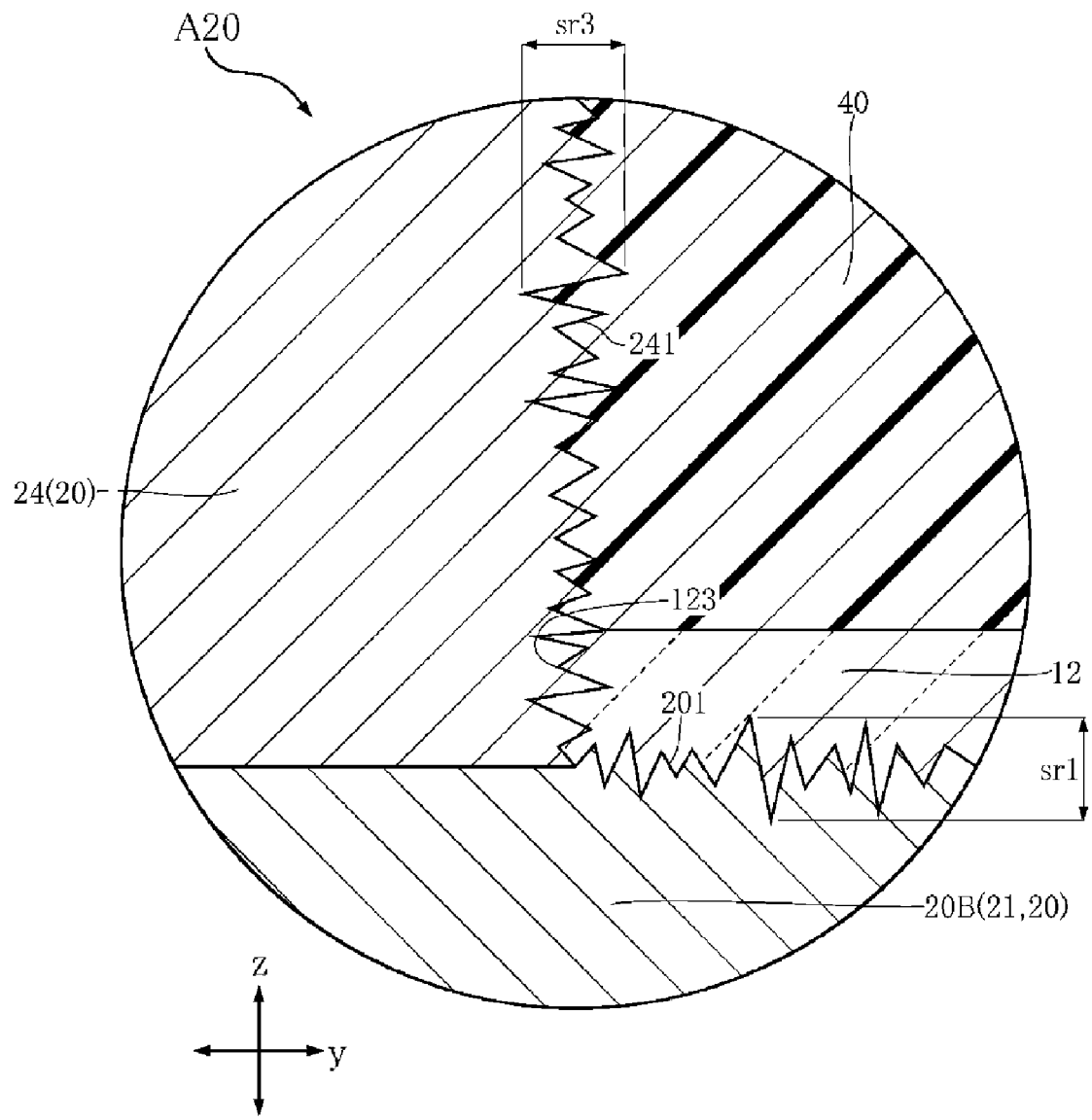
FIG. 31 is a partially enlarged view of FIG. 30.

As shown in FIGS. 10 and 31, the surface roughness sr3 of the inner side surface 241 of each of the plurality of columnar portions 24 is larger than the surface roughness sr2 of the rear surface 202 of the wiring layer 20. The surface roughness sr3 of the inner side surface 241 is a distance between the bottommost portion located inside the wiring layer 20 in the inner side surface 241 and the topmost portion located farthest from the bottommost portion in a direction which the inner side surface 241 faces.

Next, the operation and effects of the semiconductor device A20 will be described.

The semiconductor device A20 includes the wiring layer 20 having the main surface 201 and the rear surface 202, the first insulating layer 11 covering the entirety of the rear surface 202, the second insulating layer 12 in contact with the main surface 201, the semiconductor element 31 which faces the second insulating layer 12 and is mounted on the wiring layer 20, and the sealing resin 40 covering the semiconductor element 31. The main surface 201 and the rear surface 202 face opposite sides in the thickness direction z. As shown in FIG. 10, the surface roughness sr1 of the main surface 201 is larger than the surface roughness sr2 of the rear surface 202. Therefore, in the semiconductor device A20 as well, the adhesion between the wiring layer 20 and the insulating layer (the second insulating layer 12) covering the wiring layer 20 can be further improved.

In the semiconductor device A20, the wiring layer 20 has the columnar portions 24 extending from the main surface 201 of any of the base portions 21 in the thickness direction z. Each of the plurality of columnar portions 24 has the inner side surface 241 and the outer side surface 242, which face opposite sides. The outer side surface 242 is exposed from the sealing resin 40. The side portion 502 of each of the plurality of terminals 50 covers the outer side surface 242 of any of the plurality of columnar portions 24. As a result, the dimension of the side portion 502 of each of the plurality of terminals 50 in the thickness direction z becomes larger. Therefore, when the semiconductor device A20 is mounted on the wiring board by solder, the volume of the solder attached to the side portion 502 of each of the plurality of terminals 50 becomes larger. Therefore, the mounting strength of the semiconductor device A20 to the wiring board can be more enhanced than the mounting strength of the semiconductor device A10.

The inner side surfaces 241 of the plurality of columnar portions 24 of the wiring layer 20 are in contact with the sealing resin 40. The surface roughness sr3 of the inner side surface 241 of each of the plurality of columnar portions 24 is larger than the surface roughness sr2 of the rear surface 202 of the wiring layer 20. As a result, the surface area per unit area (the unit area viewed along the second direction y in the semiconductor device A20) of the inner side surface 241 of each of the plurality of columnar portions 24 is larger than the surface area per unit area (the unit area view along the thickness direction z) of the rear surface 202. Therefore, similar to the relationship between the wiring layer 20 and the second insulating layer 12 of the above-described semiconductor device A20, the adhesion between the plurality of columnar portions 24 and the sealing resin 40 in contact therewith can be further improved.

The present disclosure may not be limited to the above-described semiconductor device A10 and semiconductor device A20. The specific configuration of each part of the present disclosure can be modified in various ways in design.

According to the present disclosure, in some embodiments, it is possible to provide a semiconductor device which is capable of further improving the adhesion between a wiring layer and an insulating layer that covers the wiring layer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
    a wiring layer having a main surface and a rear surface which face opposite sides in a thickness direction;
    a first insulating layer covering an entirety of the rear surface;
    a second insulating layer which is in contact with the main surface;
    a semiconductor element which faces the second insulating layer and is mounted on the wiring layer;

a sealing resin which is in contact with the second insulating layer and covers the semiconductor element, and a plurality of electronic components, wherein a surface roughness of the main surface is larger than a surface roughness of the rear surface, wherein the first insulating layer and the second insulating layer are made of a material containing an organic compound, wherein the wiring layer includes a plurality of first bump portions protruding from the main surface in the thickness direction, wherein the semiconductor element includes a plurality of pads facing the plurality of first bump portions, wherein the plurality of pads are individually bonded to the plurality of first bump portions, wherein the second insulating layer includes a plurality of first openings which penetrate the second insulating layer in the thickness direction, wherein the plurality of first bump portions are individually accommodated in the plurality of first openings, wherein each of the plurality of electronic components includes a pair of electrodes which are located to be spaced apart from each other, wherein the wiring layer includes a plurality of second bump portions which protrude from the main surface in the thickness direction, wherein the pair of electrodes of each of the plurality of electronic components is individually bonded to two adjacent second bump portions of the plurality of second bump portions, and wherein an area of each of the plurality of second bump portions is larger than an area of each of the plurality of first bump portions when viewed along the thickness direction.

2. The semiconductor device of claim 1, wherein the second insulating layer covers an entirety of the main surface.

3. The semiconductor device of claim 1, wherein the second insulating layer is in contact with the first insulating layer.

4. The semiconductor device of claim 1, wherein the second insulating layer includes a plurality of second openings which penetrate in the thickness direction, and wherein the plurality of second bump portions are individually accommodated in the plurality of second openings.

* * * * *